United States Patent
Kim et al.

(10) Patent No.: US 10,067,277 B2
(45) Date of Patent: Sep. 4, 2018

(54) COMPENSATION FILM, AND OPTICAL FILM AND DISPLAY DEVICE INCLUDING THE SAME

(71) Applicants: Samsung Electronics Co., Ltd., Suwon-si (KR); SAMSUNG SDI CO., LTD., Yongin-si (KR)

(72) Inventors: Hyung Jun Kim, Suwon-si (KR); Ji-Hoon Lee, Jeonju-si (KR); Hye Young Kong, Uijeongbu-si (KR); Jong Hoon Won, Yongin-si (KR); Myung Sup Jung, Seongnam-si (KR)

(73) Assignees: SAMSUNG ELECTRONICS CO., LTD., Gyeonggi-Do (KR); SAMSUNG SDI CO., LTD., Gyeonggi-Do (KR)

( * ) Notice: Subject to any disclaimer, the term of this patent is extended or adjusted under 35 U.S.C. 154(b) by 512 days.

(21) Appl. No.: 14/712,662

(22) Filed: May 14, 2015

(65) Prior Publication Data
US 2016/0154159 A1    Jun. 2, 2016

(30) Foreign Application Priority Data
Dec. 1, 2014    (KR) .................. 10-2014-0169674

(51) Int. Cl.
*G02B 5/30* (2006.01)
*H01L 51/52* (2006.01)
*G02F 1/13363* (2006.01)

(52) U.S. Cl.
CPC ..... *G02B 5/3083* (2013.01); *G02F 1/133634* (2013.01); *H01L 51/5275* (2013.01);
(Continued)

(58) Field of Classification Search
CPC ............. G02B 5/3083; G02F 1/13363; G02F 1/133634; G02F 2001/133637;
(Continued)

(56) References Cited

U.S. PATENT DOCUMENTS 7,001,967 B2    2/2006    Toyomasu et al.
7,350,929 B2    4/2008    Colpaert et al.
(Continued)

FOREIGN PATENT DOCUMENTS

CN    101910888    12/2010
EP    2237086    10/2010
(Continued)

*Primary Examiner* — Ruiyun Zhang
(74) *Attorney, Agent, or Firm* — Cantor Colburn LLP

(57) ABSTRACT

A compensation film includes a first retardation layer comprising a polymer having negative birefringence, and a second retardation layer comprising a polymer having negative birefringence, where the first retardation layer has an in-plane retardation ($R_{e1}$) in a range of about 180 nanometers to about 300 nanometers for incident light having a wavelength of about 550 nanometers, the second retardation layer has an in-plane retardation ($R_{e2}$) in a range of about 60 nanometers to about 170 nanometers for the incident light having the wavelength of about 550 nanometers, and the entire in-plane retardation ($R_{e0}$) of the first retardation layer and the second retardation layer for incident light having wavelengths of about 450 nanometers and about 550 nanometers satisfies the following inequation: $R_{e0}$ (450 nm)<$R_{e0}$ (550 nm).

18 Claims, 22 Drawing Sheets

(52) U.S. Cl.
CPC ............... _H01L 51/5281_ (2013.01); _G02F 2001/133637_ (2013.01); _G02F 2001/133638_ (2013.01); _Y10T 428/10_ (2015.01); _Y10T 428/1036_ (2015.01)

(58) Field of Classification Search
CPC ..... G02F 2001/133638; H01L 51/5275; H01L 51/5281; Y10T 428/10; Y10T 428/1036; Y10T 428/105
USPC ............ 428/1.1, 1.3, 1.33; 349/96, 117–119; 359/489.06, 489.07
See application file for complete search history.

(56) References Cited

U.S. PATENT DOCUMENTS

| | | | |
|---|---|---|---|
| 7,476,425 B2 | 1/2009 | Obara et al. | |
| 7,948,591 B2 | 5/2011 | Sakai | |
| 8,031,308 B2 | 10/2011 | Sakai | |
| 8,139,188 B2 | 3/2012 | Sakai | |
| 8,284,358 B2 | 10/2012 | Sakai et al. | |
| 2004/0190138 A1 | 9/2004 | Toyomasu et al. | |
| 2006/0132721 A1 | 6/2006 | Gerets | |
| 2006/0132722 A1 | 6/2006 | Colpaert | |
| 2009/0096970 A1* | 4/2009 | Sakai ................... G02B 5/3016 349/117 | |
| 2010/0272971 A1 | 10/2010 | Miyai et al. | |
| 2010/0315710 A1 | 12/2010 | Sugino et al. | |

FOREIGN PATENT DOCUMENTS

| | | |
|---|---|---|
| JP | 2006178460 | 7/2006 |
| JP | 2009339806 | 7/2009 |
| JP | 2013190757 | 9/2013 |
| KR | 1020070041727 | 4/2007 |
| KR | 1020090028574 | 3/2009 |
| KR | 1020100037658 | 9/2010 |
| KR | 20100106450 | 10/2010 |
| WO | 2008001582 | 1/2008 |
| WO | 2009084663 | 7/2009 |

* cited by examiner

COMPENSATION FILM, AND OPTICAL FILM AND DISPLAY DEVICE INCLUDING THE SAME

CROSS-REFERENCE TO RELATED APPLICATION

This application claims priority to Korean Patent Application No. 10-2014-0169674 filed on Dec. 1, 2014, and all the benefits accruing therefrom under 35 U.S.C. § 119, the content of which in its entirety is herein incorporated by reference.

BACKGROUND

1. Field

Embodiments of the invention relate to a compensation film, an optical film including the compensation film, and a display device including the compensation film or the optical film.

2. Description of the Related Art

A flat panel displays may be classified into a light-emitting display device that emits light by itself and a non-emissive display device that includes a separate light source, and a compensation film such as a retardation film is generally employed for improving the image quality thereof.

In the case of the light emitting display device, for example, an organic light emitting diode ("OLED") display, the visibility and the contrast ratio may be deteriorated by reflection of the exterior light caused by a metal such as an electrode. To reduce the deterioration in the visibility and the contrast ratio, the linear polarized light is shifted into circularly polarized light by using a polarizer and a compensation film, so that reflection of the external light by the OLED display and leakage thereof to the outside may be effectively prevented.

To reduce the reflection of the exterior light, a liquid crystal display ("LCD"), which is a non-emissive display device, changes the linear polarized light into the circularly polarized light to improve the image quality according to the type of the device such a transparent type, a transflective type, or a reflective type, for example.

SUMMARY

Optical properties of a conventional compensation film may be substantially dependent upon the wavelength of incident light, so such a compensation film may effectively operate for light having a certain wavelength, but the effect thereof may be deteriorated for other wavelengths. In addition, a conventional compensation film may have a strong viewing angle dependency.

An embodiment of the invention provides a compensation film with improved display characteristics by reducing the wavelength dependency and the viewing angle dependency.

Another embodiment of the invention provides an optical film including the compensation film.

Another embodiment of the invention provides a display device including the compensation film.

According to an embodiment, a compensation film includes a first retardation layer including a polymer having negative birefringence, and a second retardation layer including a polymer having negative birefringence. In such an embodiment, the first retardation layer has an in-plane retardation ($R_{e1}$) in a range of about 180 nanometers (nm) to about 300 nm for incident light having a wavelength of about 550 nm, the second retardation layer has an in-plane retardation ($R_{e2}$) in a range of about 60 nm to about 170 nm for the incident light having the wavelength of about 550 nm, an entire in-plane retardation ($R_{e0}$) of the first retardation layer and the second retardation layer for incident light having wavelengths of about 450 nm and about 550 nm satisfies the following inequation: $R_{e0}$ (450 nm)<$R_{e0}$ (550 nm).

In an embodiment, the entire in-plane retardation ($R_{e0}$) of the first retardation layer and the second retardation layer for the incident light having the wavelengths of about 450 nm and about 550 nm may satisfy the following inequation: $0.7 \leq R_{e0}(450\text{ nm})/R_{e0}(550\text{ nm})<1.0$.

In an embodiment, an angle between a slow axis of the first retardation layer and the slow axis of a second retardation layer may be from about 20° to about 85°.

In an embodiment, the angle between the slow axis of the first retardation layer and the slow axis of the second retardation layer may be from about 25° to about 80°.

In an embodiment, the angle between the slow axis of the first retardation layer and the slow axis of the second retardation layer may be from about 30° to about 70°.

In an embodiment, an angle between a fast axis of the first retardation layer and a fast axis of the second retardation layer may be from about 20° to about 80°.

In an embodiment, the angle between the fast axis of the first retardation layer and the fast axis of the second retardation layer may be from about 25° to about 75°.

In an embodiment, the first retardation layer may include an elongated polymer film including the polymer of the first retardation layer, refractive indices of the first retardation layer may satisfy the following inequation: $n_{x1}<n_{y1} \leq n_{z1}$ or $n_{x1}<n_{z1} \leq n_{y1}$, where $n_{x1}$ denotes a refractive index in an elongation direction of the polymer film of the first retardation layer, $n_{y1}$ denotes an in-plane refractive index in a direction perpendicular to a direction of the $n_{x1}$, and $n_{z1}$ is an out-of-plane refractive index in a direction perpendicular to both directions of $n_{x1}$ and $n_{y1}$.

In an embodiment, the second retardation layer may include an elongated polymer film including the polymer of the second retardation layer, and refractive indices of the second retardation layer may satisfy the following inequation: $n_{x2}<n_{y2} \leq n_{z2}$ or $n_{x2}<n_{z2} \leq n_{y2}$, where $n_{x2}$ denotes a refractive index in an elongation direction of the polymer film of the second retardation layer, $n_{y2}$ denotes an in-plane refractive index in a direction perpendicular to a direction of the $n_{x2}$, and $n_{z2}$ denotes an out-of-plane refractive index in a direction perpendicular to both directions of $n_{x2}$ and $n_{y2}$.

In an embodiment, each of the polymer of the first retardation layer and the polymer of the second retardation layer may independently include polystyrene, poly(styrene-co-maleic anhydride), polymaleimide, poly(meth)acrylic acid, polyacrylonitrile, polymethyl(meth)acrylate, cellulose ester, poly(styrene-co-acrylonitrile), poly(styrene-co-maleimide), poly(styrene-co-methacrylic acid), a derivative thereof, a copolymer thereof, or a mixture thereof.

In another embodiment, an optical film may include a polarizer and an embodiment of the compensation film described above.

In yet another embodiment, a display device may include a display panel, a compensation film deposed on a surface of the display panel, and a polarizer disposed on a surface of the compensation film, where the compensation film includes a first retardation layer including a polymer having negative birefringence and a second retardation layer including a polymer having negative birefringence, where the first retardation layer has an in-plane retardation ($R_{e1}$) in a range of about 180 nanometers (nm) to about 300 nm for incident light having a wavelength of about 550 nm, the second retardation layer has an in-plane retardation ($R_{e2}$) in a range of about 60 nm to about 170 nm for the incident light having the wavelength of about 550 nm, and the entire in-plane retardation ($R_{e0}$) of the first retardation layer and the second retardation layer for incident light having wavelengths of about 450 nm and about 550 nm satisfies the following inequation: $R_{e0}$ (450 nm)<$R_{e0}$ (550 nm).

In an embodiment, the entire in-plane retardation ($R_{e0}$) of the first retardation layer and the second retardation layer for the incident light having the wavelengths of about 450 nm and about 550 nm may satisfy the following inequation: $0.7 \leq R_{e0}(450\ \text{nm})/R_{e0}(550\ \text{nm}) < 1.0$.

In an embodiment, an angle between a slow axis of the first retardation layer and a slow axis of the second retardation layer may be from about 20° to about 85°.

In an embodiment, an angle between a fast axis of the first retardation layer and a fast axis of the second retardation layer may be from about 20° to about 80°.

In an embodiment, the first retardation layer may include an elongated polymer film including the polymer of the first retardation layer, refractive indices of the first retardation layer may satisfy the following Inequation: $n_{x1} < n_{z1} \leq n_{y1}$ or $n_{x1} < n_{z1} \leq n_{y1}$, where $n_{x1}$ denotes a refractive index in an elongation direction of the polymer film of the first retardation layer, $n_{y1}$ denotes an in-plane refractive index in a direction perpendicular to a direction of the $n_{x1}$, and $n_{z1}$ denotes an out-of-plane refractive index in a direction perpendicular to both directions of $n_{x1}$ and $n_{y1}$, In an embodiment, the polymer of the second retardation layer may include an elongated polymer film including the polymer of the second retardation layer, and refractive indices of the second retardation layer satisfy the following inequation: $n_{x2} < n_{y2} \leq n_{z2}$ or $n_{x2} < n_{z2} \leq n_{y2}$, where $n_{x2}$ denotes a refractive index in an elongation direction of the polymer film of the second retardation layer, $n_{y2}$ denotes an in-plane refractive index in a direction perpendicular to a direction of the $n_{x2}$, and $n_{z2}$ denotes an out-of-plane refractive index in a direction perpendicular to both directions of $n_{x2}$ and $n_{y2}$.

In an embodiment, each of the polymer of the first retardation layer and the polymer of the second retardation layer may independently include polystyrene, poly(styrene-co-maleic anhydride), polymaleimide, poly(meth)acrylic acid, polyacrylonitrile, polymethyl(meth)acrylate, cellulose ester, poly(styrene-co-acrylonitrile), poly(styrene-co-maleimide), poly(styrene-co-methacrylic acid), a derivative thereof, a copolymer thereof, or a mixture thereof.

In an embodiment, the display panel may be a liquid crystal panel or an organic light emitting panel.

BRIEF DESCRIPTION OF THE DRAWINGS

The above and other features of the invention will become more apparent by describing in detailed exemplary embodiments thereof with reference to the accompanying drawings, in which.

DETAILED DESCRIPTION

Figure 1:
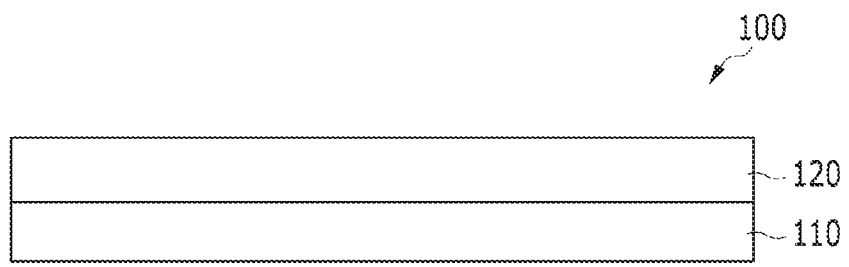
FIG. 1 is a cross-sectional view schematically showing an embodiment of a compensation film, according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, an embodiment of a compensation film according to the invention will be described referring to FIG. 1.

FIG. 1 is a cross-sectional view schematically showing an embodiment of a compensation film, according to the invention.

Referring to FIG. 1, an embodiment of the compensation film 100 includes a first retardation layer 110 and a second retardation layer 120.

In such an embodiment, both the first retardation layer 110 and the second retardation layer 120 include a polymer having negative birefringence.

The birefringence ($\Delta n$) is a difference found by subtracting the refractive index ($n_o$) of light propagating perpendicular to an optical axis from the refractive index ($n_e$) of light propagating parallel to the optical axis. In an embodiment, both the first retardation layer 110 and the second retardation layer 120 have negative birefringence.

In such an embodiment, the polymer having negative birefringence may include, for example, polystyrene, poly(styrene-co-maleic anhydride), polymaleimide, poly(meth)acrylic acid, polyacrylonitrile, polymethyl(meth)acrylate, cellulose ester, poly(styrene-co-acrylonitrile), poly(styrene-co-maleimide), poly(styrene-co-methacrylic acid), or a combination thereof (e.g., a derivative thereof, a copolymer thereof, or a mixture thereof), but is not limited thereto.

The polymer having negative birefringence of the first retardation layer 110 may be substantially the same as or different from the polymer having negative birefringence of the second retardation layer 120.

In such an embodiment, the polymer having negative birefringence included in the first retardation layer 110 and the second retardation layer 120 may maintain negative birefringence after being elongated.

In such an embodiment, refractive indices of the polymer of the first retardation layer may satisfy Inequation 2 or 3, and refractive indices of the polymer of the second retardation layer may satisfy Inequation 4 or 5.

$$n_{x1} < n_{y1} \leq n_{z1} \qquad \text{Inequation 2:}$$

$$n_{x1} < n_{z1} \leq n_{y1} \qquad \text{Inequation 3:}$$

$$n_{x2} < n_{y2} \leq n_{z2} \qquad \text{Inequation 4:}$$

$$n_{x2} < n_{z2} \leq n_{y2} \qquad \text{Inequation 5:}$$

In Inequations 2 and 3, $n_{x1}$ denotes a refractive index of the polymer (e.g., a polymer film) of the first retardation layer in a predetermined direction (e.g., drawn or elongated direction), $n_{y1}$ denotes an in-plane refractive index thereof in a direction perpendicular to the direction of the $n_{x1}$, and $n_{z1}$ denotes an out-of-plane refractive index thereof in a direction perpendicular to both directions of $n_{x1}$ and $n_{y1}$.

In Inequations 4 and 5, $n_{x2}$ denotes a refractive index of the polymer of the second retardation layer in a predetermined direction (e.g., drawn or elongated direction), $n_{y2}$ denotes an in-plane refractive index thereof in a direction perpendicular to the direction of the $n_{x2}$, and $n_{z2}$ denotes an out-of-plane refractive index thereof in a direction perpendicular to both directions of $n_{x2}$ and $n_{y2}$.

In such an embodiment, both the first retardation layer 110 and the second retardation layer 120 include a polymer having negative birefringence, and thus, both have forward wavelength dispersion retardation. The first retardation layer 110 and the second retardation layer 120 having the forward wavelength dispersion retardation may have higher retardation to light having a short wavelength than the retardation to light having a long wavelength.

A display device having good display characteristics typically includes an optical means having a lower retardation to light having a short wavelength (referred to as the reverse wavelength dispersion retardation), which is opposite to the wavelength dispersion retardation shown in general polymers or an optical means fabricated therefrom.

The retardation of a film may be defined by in-plane retardation ($R_e$) and out-of-plane retardation ($R_{th}$).

The in-plane retardation ($R_e$) of the film may be represented by $R_e = (n_1 - n_2) \times d$. Herein, $n_1$ denotes a refractive index of the film in a direction having a highest refractive index in a plane of the film (hereinafter referred to as "slow axis"), $n_2$ denotes a refractive index of the film in a direction having a lowest refractive index in the plane of the film (hereinafter referred to as "fast axis"), that is, a refractive index in a direction perpendicular to the direction of the refractive index of $n_1$ in the plane of the film, and d denotes a thickness of the film.

In such an embodiment, where both the first retardation layer 110 and the second retardation layer 120 have negative birefringence, the in-plane retardation ($R_{e1}$) of the first retardation layer 110 may be represented by $R_{e1} = (n_{y1} - n_{x1}) \times d_1$, and the in-plane retardation ($R_{e2}$) of the second retardation layer 120 may be represented by $R_{e2} = (n_{y2} - n_{x2}) \times d_2$.

Herein, $n_{y1}$ denotes a refractive index at the slow axis of the first retardation layer 110, that is, a refractive index in a direction perpendicular to the elongation direction of the polymer of the first retardation layer 110, $n_{x1}$ denotes a refractive index at the fast axis of the first retardation layer 110, that is, a refractive index in an elongation direction of the polymer of the first retardation layer 110, $d_1$ denotes a film thickness of the first retardation layer 110, $n_{y2}$ denotes a refractive index at the slow axis of the second retardation layer 120, that is, a refractive index in a direction perpendicular to the elongation direction of the polymer of the second retardation layer 120, $n_{x2}$ denotes a refractive index at the fast axis of the second retardation layer 120, that is, a refractive index in an elongation direction of the polymer of the second retardation layer 120, and $d_2$ denotes a film thickness of the second retardation layer 120.

According to an embodiment, the first retardation layer 110 may have an in-plane retardation ($R_{e1}$) in a range of from about 180 nanometers (nm) to about 300 nm, for example, from about 200 nm to about 260 nm, for incident light having a wavelength of about 550 nm (hereinafter referred to as a "reference wavelength"), the second retardation layer 120 may have an in-plane retardation ($R_{e2}$) in a range of from about 60 nm to about 170 nm, for example, from about 80 nm to about 150 nm, for the incident light having the reference wavelength.

In the first retardation layer 110 and the second retardation layer 120, the retardation of light having a short wavelength may be higher than the retardation of light having a long wavelength, as described above. In one embodiment, for example, the in-plane retardation ($R_{e1}$) of the first retardation layer 110 for light having the wavelengths of 450 nm, 550 nm and 650 nm may satisfy the following inequation: $R_{e1}$ (450 nm)≤$R_{e1}$ (550 nm)>$R_{e1}$ (650 nm) or $R_{e1}$ (450 nm)>$R_{e1}$ (550 nm)≤$R_{e1}$ (650 nm), and the in-plane retardation ($R_{e2}$) of the second retardation layer 120 may satisfy the following inequation: $R_{e2}$ (450 nm)≥$R_{e2}$ (550 nm)>$R_{e2}$ (650 nm) or $R_{e2}$ (450 nm)>$R_{e2}$ (550 nm)≥$R_{e2}$ (650 nm).

The changing of retardation of the short wavelength for the reference wavelength may be referred to as short wavelength dispersion, the short wavelength dispersion of the first retardation layer 110 may be represented by $R_{e1}$ (450 nm)/$R_{e1}$ (550 nm), and the short wavelength dispersion of the second retardation layer 120 may be represented by $R_{e2}$ (450 nm)/$R_{e2}$ (550 nm), and the short wavelength dispersion of the compensation film 100 may be represented by $R_{e0}$ (450 nm)/$R_{e0}$ (550 nm).

As described above, in such an embodiment, where both the first retardation layer 110 and the second retardation layer 120 have the forward wavelength dispersion retardation, the compensation film 100 including the first retardation layer 110 and the second retardation layer 120 may have a forward wavelength dispersion retardation as expressed by $R_{e0}$(450 nm)<$R_{e0}$(550 nm) in a short wavelength region, that is, the wavelength region equal to or lower than the reference wavelength (550 nm).

In one embodiment, for example, the compensation film 100 may satisfies Inequation 1.

$$0.7 \leq R_{e0}(450 \text{ nm})/R_{e0}(550 \text{ nm}) < 1.0 \qquad \text{Inequation 1:}$$

As shown in FIG. 1, an embodiment of the compensation film 100 may be fabricated by assembling a first retardation layer 110 and a second retardation layer. In such an embodiment, the retardation of the compensation film 100 fabricated therefrom may be controlled or changed by changing the angle between the slow axes or the fast axes of the first retardation layer 110 and the second retardation layer 120.

Figure 2:
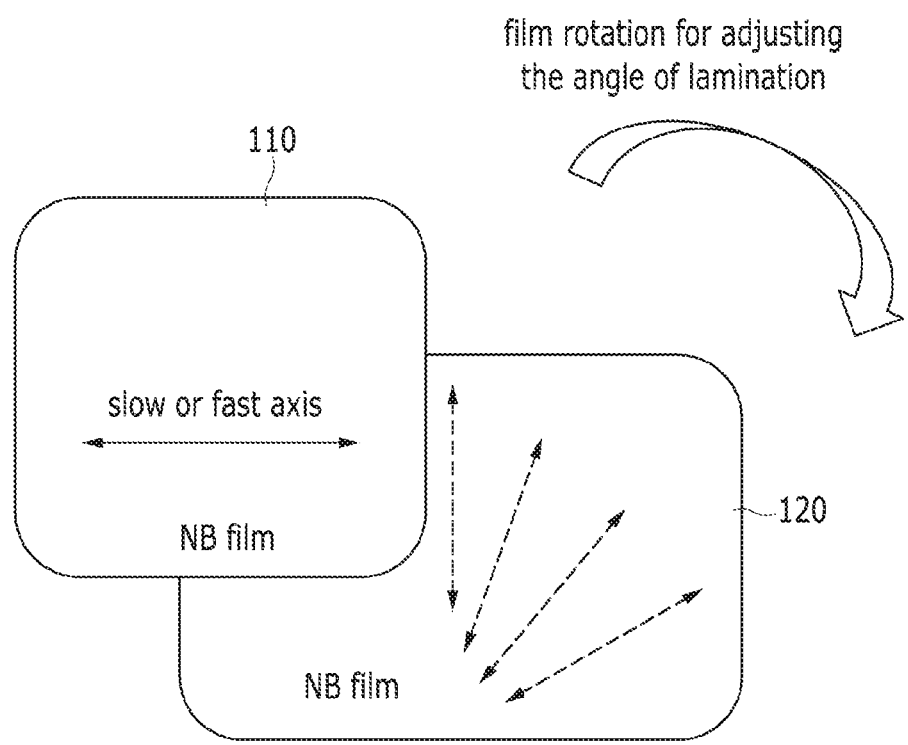
FIG. 2 is a top plan view schematically showing a method of assembling a first retardation layer and a second retardation layer by changing the angle between the slow axes or the fast axes of the first and second retardation layers to prepare a compensation film shown in FIG. 1.

In an embodiment, as schematically shown in FIG. 2, referring to either of slow axis or fast axis of the first retardation layer 110, the second retardation layer 120 is assembled with the first retardation layer 110 by rotating the slow or fast axis of the second retardation layer 120 such that the angle between the slow or fast axes of the first retardation layer 110 and the second retardation layer 120 to have a predetermined angle. The compensation films fabricated by changing the angle between the slow or fast axes of the first retardation layer 110 and the second retardation layer 120 may have a retardation that changes depending on the angle between the slow or fast axes of the first retardation layer 110 and the second retardation layer 120, even when the first retardation layer and the second retardation layer include substantially the same as each other, e.g., made from the same material as each other, as shown from FIGS. 7 to 22.

Figure 9:
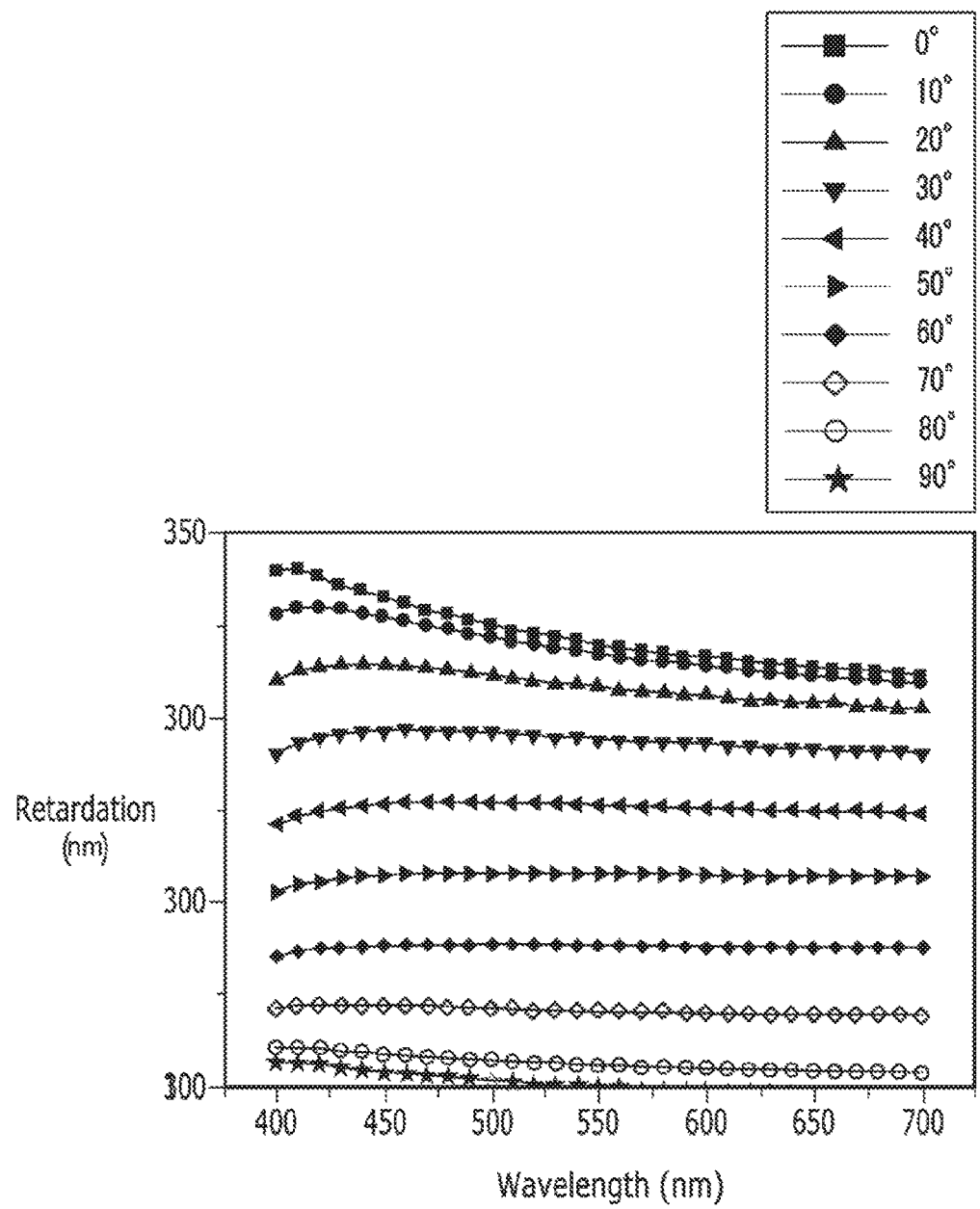
FIG. 9 shows graphs of retardation ($R_e$) versus wavelength of the compensation films prepared in Example 2 by changing the angle between the slow axes of a first retardation layer and a second retardation layer.
Figure 10:
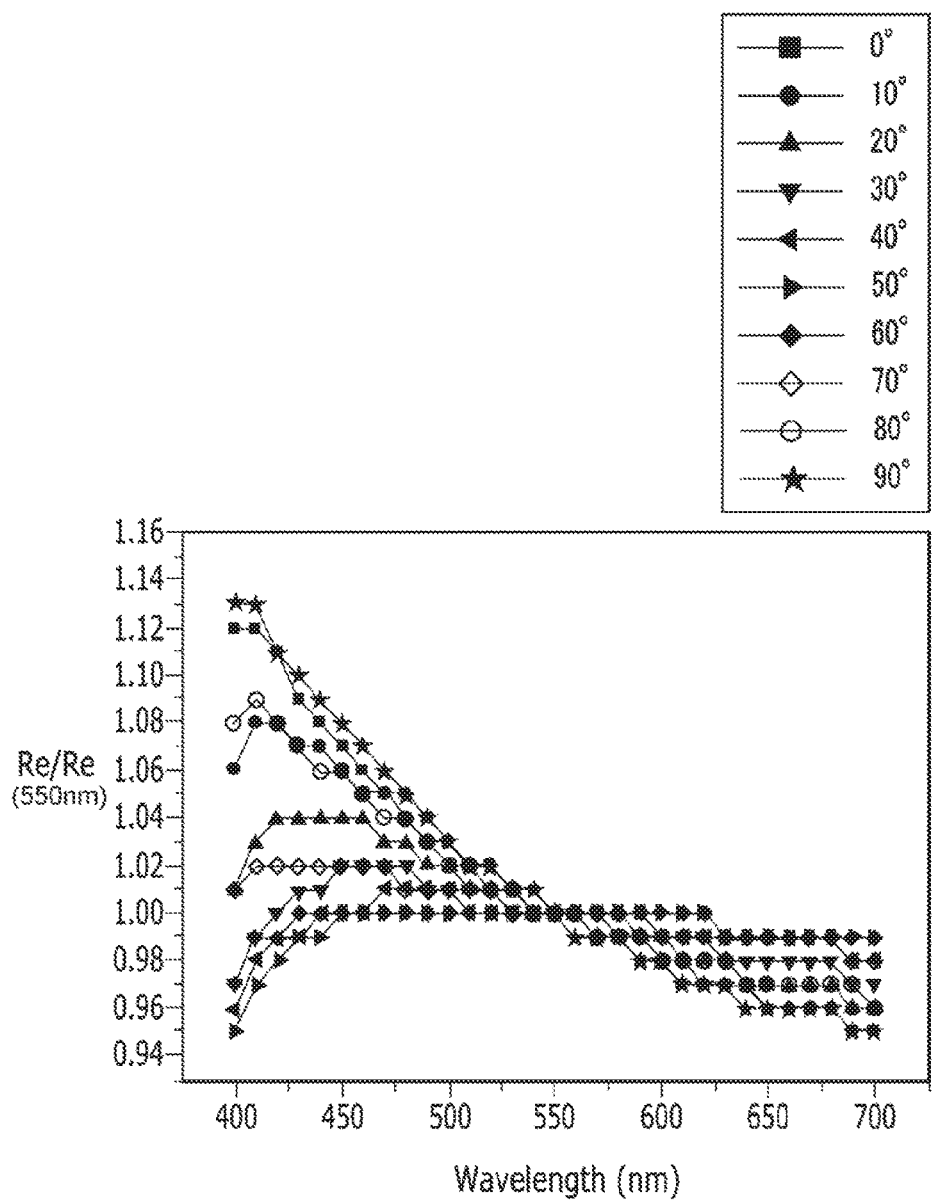
FIG. 10 shows graphs of wavelength dispersion ($R_e/R_e$ (550 nm)) versus wavelength of the compensation films prepared in Example 2.

In one embodiment, for example, as shown in FIG. 9, the compensation films fabricated from a first retardation layer having a retardation of 220 nm and a second retardation layer having a retardation of 120 nm as in Example 2, which will be described later in detail, by changing the angle between the slow axes of the first retardation layer and the second retardation layer from 0° to 90°, have the retardations from about 100 nm to about 380 nm in the visible wavelength region (from 400 nm to 700 nm). Further, FIG. 10 shows graphs of the wavelength dispersion converted from the retardations of the compensation films in FIG. 9 for the reference wavelength (550 nm). In an embodiment, as shown in FIG. 10, wavelength dispersion of a compensation film may vary by changing the angle of lamination of the first retardation layer and the second retardation layer. As shown in FIG. 10, when the compensation film fabricated by fixing the angle between the slow axes of the first retardation layer and the second retardation layer as 50° has the wavelength dispersion of $Re/R_e(550\ nm)$ as being less than 1 in the wavelength region of 400 nm to 550 nm. In such an embodiment, when the compensation film is fabricated by fixing the angle between the slow axes of the first retardation layer and the second retardation layer as 80°, the compensation film has the wavelength dispersion of $Re/R_e(550\ nm)$, which is equal to or greater than 1.3 in the wavelength region of 400 nm to 550 nm, and the film has a higher retardation for the shorter wavelength of incident light.

As described above, the compensation film fabricated by changing the angle between the slow or fast axes of the first and second retardation layers having different retardations from each other after being elongated according to an embodiment may have different retardations depending on the angle. Accordingly, an embodiment of the compensation film may have reverse wavelength dispersion retardation by adjusting the angle between the slow or fast axes of the first and second retardation layers having different retardations from each other to be in a predetermined range.

In one embodiment, for example, the angle between the slow axes of the first retardation layer and the second retardation layer may be from 20° to 85°, but is not limited the angle between the slow axes of the first retardation layer and the second retardation layer is in a range from 20° to 85°, the compensation film may have reverse wavelength dispersion retardation, that is, for example, the compensation film may satisfy the following inequation: $0.7 \leq R_{e0}(450\ nm)/R_{e0}(550\ nm) < 1.0$. In one exemplary embodiment, for example, the angle between the slow axes of the first retardation layer and the second retardation layer may be from 25° to 80° or from 30° to 70°.

In one embodiment, for example, the angle between the fast axes of the first retardation layer and the second retardation layer may be from 20° to 80°, but is not limited thereto. In such an embodiment, where the angle between the fast axes of the first retardation layer and the second retardation layer is in a range from 20° to 80°, the compensation film may have reverse wavelength dispersion retardation, that is, for example, the compensation film may satisfy the following inequation: $0.7 \leq R_{e0}(450\ nm)/R_{e0}(550\ nm) < 1.0$. In one embodiment, for example, the angle between the fast axes of the first retardation layer and the second retardation layer may be from 25° to 75° or from 30° to 70°.

The first retardation layer and the second retardation layer may include any known polymer having negative birefringence, and the polymer of the first retardation layer and the polymer of second retardation layer may be the same as or different from each other. Accordingly, the range of selection of a polymer for being used in fabricating an embodiment of a compensation film having reverse wavelength dispersion retardation is substantially broad. In such an embodiment, a compensation film having desired reverse wavelength dispersion retardation may be effectively provided or manufactured by changing retardation of a first retardation layer or a second retardation layer or changing the angle of lamination of the first retardation layer and the second retardation layer. Accordingly, the method of preparing an embodiment of a compensation film according to the invention is substantially simplified and cost effective.

The first retardation layer or the second retardation layer may be prepared by elongating a polymer film for preparing the layer to have a predetermined retardation. In one embodiment, for example, a polymer may be uniaxially or biaxially elongated to a degree of 50% to 150% at a temperature of $Tg-20°\ C. \leq Tg \leq Tg+20°\ C.$, where 'Tg' denotes a glass transition temperature of a polymer.

Thickness of the first retardation layer or the second retardation layer may be from about 30 μm to about 60 μm, but is not limited thereto. In such an embodiment, where thickness of the first retardation layer or the second retardation layer is in a range from about 30 μm to about 60 μm, the first or second retardation layer may have an appropriate retardation, and may be efficiently or effectively laminated one to the other.

In such an embodiment, the compensation property of the compensation film may be reinforced by reducing wavelength dependency or viewing angle dependency thereof.

In an embodiment, the thickness direction retardation ($R_{th}$) is retardation generated in a thickness direction of a film, and the thickness direction retardation ($R_{th1}$) of the first retardation layer 110 may be represented by the following equation: $R_{th1}=[\{(n_{x1}+n_{y1})/2\}-n_{z1}] \times d_1$, the thickness direction retardation ($R_{th2}$) of the second retardation layer 120 may be represented by the following equation: $R_{th2}=[\{(n_{x2}+n_{y2})/2\}-n_{z2}] \times d_2$. Herein, $n_{x1}$ denotes a refractive index in an elongation direction of the first retardation layer 110, $n_{y1}$ denotes a refractive index in a direction perpendicular to a direction of $n_{x1}$, i.e., the elongation direction of the first retardation layer 110, $n_{z1}$ denotes a refractive index in the direction perpendicular to the directions of the refractive indexes $n_{x1}$ and $n_{y1}$, $n_{x2}$ denotes a refractive index in an elongation direction of the second retardation layer 120, $n_{y2}$ denotes a refractive index in a direction perpendicular to a direction of $n_{x2}$, i.e., the elongation direction of the second retardation layer 120, and $n_{z2}$ denotes a refractive index in the direction perpendicular to the directions of the refractive indexes of $n_{x2}$ and $n_{y2}$.

In an exemplary embodiment, where the first retardation layer 110 and the second retardation layer 120 have negative birefringence, the first retardation layer 110 and the second retardation layer 120 may have the thickness direction retardations ($R_{th1}$ and $R_{th2}$) of less than zero (0).

In such an embodiment, where both of the thickness direction retardations of the first retardation layer 110 and of the second retardation layer 120 are less than zero (0), the thickness direction retardation ($R_{th0}$) of the compensation film 100 may be less than zero (0).

In an embodiment of the invention, the compensation film 100 include the first retardation layer 110 and the second retardation layer 120, which are disposed one on the other with a predetermined angle between the fast axes or between the slow axes of the first retardation layer 110 and the second retardation layer 120 and each of which has negative birefringence. In such an embodiment, viewing angle dependency may be reduced by maintaining thickness direction retardation ($R_{thO}$) of the compensation film 100 to be negative. In such an embodiment, the compensation film 100 may accomplish reverse wavelength dispersion retardation to provide λ/4, λ/2, or any desirable retardation in the entire visible ray region. Accordingly, an embodiment of the compensation film 100 may effectively accomplish the circularly polymerized compensation function and may improve the display characteristics of the display device including the compensation film 100.

In an embodiment, the compensation film 100 may further include an adhesion layer (not shown) between the first retardation layer 110 and the second retardation layer 120. The adhesion layer may effectively couple or attach the first retardation layer 110 to the second retardation layer 120, and may include or be made of, for example, a pressure sensitive adhesive.

As described above, an embodiment of the compensation film 100 may be manufactured by preparing each of the first retardation layer 110 and the second retardation layer 120 in the form of a film, respectively, and assembling the first and second retardation layers 110 and 120 by adjusting the angle between the fast axes or the slow axes of the retardation layers to be a predetermined angle. In an embodiment, the compensation film 100 may be provided or formed by, for example, roll-to-roll coating. In such an embodiment, each of the first and second retardation layers may be first subjected to oblique stretch before being wound to a roll to allow the angle between the fast axes or slow axes of the first and second retardation layers to be a predetermined angle. The oblique stretch is a biaxial orientation in which the direction of orientation is not parallel to longitudinal direction ("MD") or lateral direction ("TD"), and the orientation ratios of MD and TD are different from each other. Accordingly, the fast axis or slow axis of a film undergone the oblique stretch may have a specific angle to the direction of the oblique stretch. Accordingly, by controlling the MD/TD orientation ratio of the first retardation layer 110 or the second retardation layer 120, the first or second retardation layer having specific orientation may be obtained. The obtained retardation layer having a specific predetermined orientation may be wound to a roll to be subjected to "roll-to-roll" process.

Such an embodiment of the compensation film 100 may be provided into an optical film together with a polarizer. The optical film may be, for example, an anti-reflective film.

Figure 3:
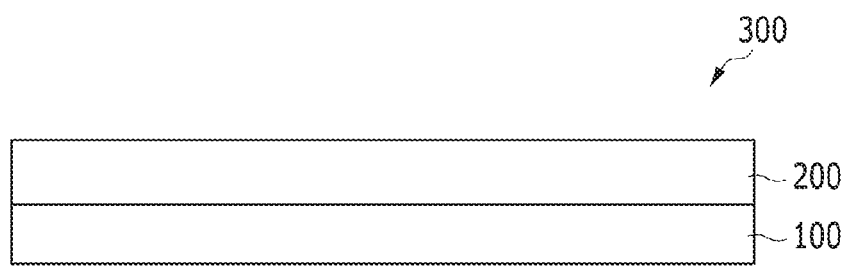
FIG. 3 is a cross-sectional view schematically showing an embodiment of an optical film according to invention.

FIG. 3 is a cross-sectional view schematically showing an embodiment of an optical film, according to the invention.

Referring to FIG. 3, an embodiment of the optical film 300 includes a compensation film 100 and a polarizer 200 disposed on a side (e.g., an upper surface) of the compensation film 100.

The compensation film 100 of the optical film 300 is substantially the same as an embodiment thereof as described above, and the first retardation layer 110 may be disposed to contact the polarizer 200.

The polarizer 200 may be disposed on the side where the light enters, and may be a linear polarizer for shifting the polarization of incident light into linear polarization. The polarizer 200 may include or be made of, for example, elongated polyvinyl alcohol ("PVA") and the polarizer 200 may be prepared by a method including, for example, elongating or drawing a PVA film, adsorbing iodine or a dichroic dye thereto, and borating and washing the PVA film.

The optical film 300 may further include a protective layer (not shown) on a surface of the polarizer 200. The protective layer may be provided for further reinforcing the functionality or improving the durability of the optical film 300, or for reducing reflection or glare, and for example, may be a cellulose triacetate ("TAC") film, but is not limited thereto.

The optical film 300 may further include a correction layer (not shown) disposed on the compensation film 100. The correction layer may be, for example, a color shift resistant layer, but is not limited thereto.

The optical film 300 may further include a light blocking layer (not shown) which extends along an edge thereof. The light blocking layer may have a strip shape and may be disposed along circumference of the optical film 300. The light blocking layer may include an opaque material, for example, a black material. In one embodiment, for example, the light blocking layer may include or be made of a black ink.

The optical film 300 may be stacked with a compensation film 100 and a polarizer 200 according to a roll-to-roll method, but is not limited thereto.

Figure 4:
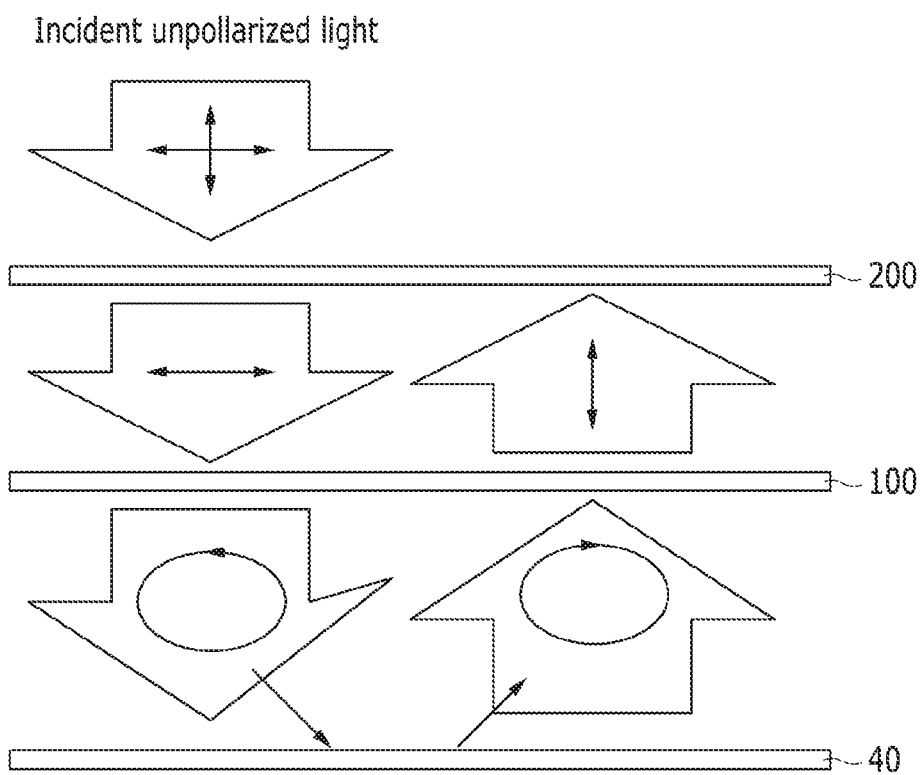
FIG. 4 is a schematic view showing the anti-reflection principle of an embodiment of an optical film according to invention.

FIG. 4 is a schematic view showing the anti-refractive principle of an embodiment of an optical film, according to the invention.

Referring to FIG. 4, while the incident unpolarized light having entered from the outside is passing through a polarizer 200, the unpolarized light is polarized. Then, the polarized light is shifted into circularly polarized light by passing through the compensation film 100, only a first polarized perpendicular component, which is a polarized perpendicular component of two polarized perpendicular components, is transmitted. While the circularly polarized light is reflected in a display panel 40 including a substrate, an electrode and so on, the circular polarization direction of the circularly polarized light is changed, and the circularly polarized light is passed through the compensation film 100 again, such that only a second polarized perpendicular component, which is the other polarized perpendicular component of the two polarized perpendicular components, may be transmitted. As the second polarized perpendicular component is blocked by the polarizer 200, light does not exit to the outside, thereby effectively preventing the external light reflection.

Such embodiments of the compensation film 100 and the optical film 200 may be applied to various display devices.

An embodiment of the display device includes a display panel, a compensation film disposed on a side (or a surface) of the display panel, and a polarizer element disposed on a side (or a surface) of the compensation film. The display panel may be a liquid crystal display panel or an organic light emitting display panel, but is not limited thereto.

Hereinafter, an embodiment of a display panel, where the display panel is an organic light emitting diode ("OLED") display, will be described with reference to FIG. 5.

Figure 5:
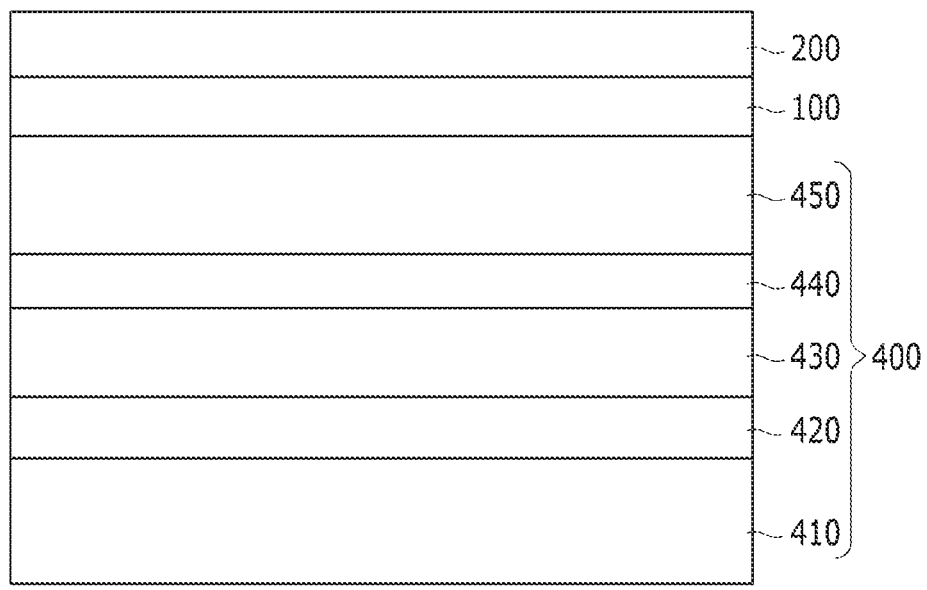
FIG. 5 is a cross-sectional view schematically showing an embodiment of an organic light emitting diode ("OLED") display.

FIG. 5 is a cross-sectional view showing an embodiment of an OLED display according to the invention.

Referring to FIG. 5, an embodiment of the OLED display includes an OLED panel 400, a compensation film 100 disposed on a side (e.g., an upper side) of OLED panel 400, and a polarization device 200 disposed on a side (e.g., an upper side) of the compensation film 100.

The OLED panel 400 may include a base substrate 410, a lower electrode 420, an organic emission layer 430, an upper electrode 440 and an encapsulation substrate 450.

The base substrate 410 may include or be made of glass or plastic, for example.

One of the lower electrode 420 and the upper electrode 440 may be an anode, and the other of the lower electrode 420 and the upper electrode 440 may be a cathode. The anode is an electrode injected with holes, and may include or be made of a transparent conductive material having a high work function to transmit the emitted light to the outside, for example, indium tin oxide ("ITO") or indium zinc oxide ("IZO"). The cathode is an electrode injected with electrons, and may be made of a conductive material having a low work function and not affecting the organic material, and may include, for example, aluminum (Al), calcium (Ca), barium (Ba) or a combination thereof.

The organic emission layer 430 includes an organic material which may emit light when applying a voltage to the lower electrode 420 and the upper electrode 440.

In such an embodiment, an auxiliary layer (not shown) may be further provided between the lower electrode 420 and the organic emission layer 430 and between the upper electrode 440 and the organic emission layer 430. The auxiliary layer is provided to balance electrons and holes, and may include a hole transport layer ("HTL"), a hole injection layer ("HIL"), an electron injection layer ("EIL"), and an electron transporting layer ("ETL").

The encapsulation substrate 450 may include or be made of glass, metal or a polymer, and may seal the lower electrode 420, the organic emission layer 430 and the upper electrode 440, to effectively prevent moisture and/or oxygen inflow from the outside.

The compensation film 100 and the polarizer 200 may be disposed on a side through which light is emitted. In one embodiment, for example, where the OLED display has bottom emission structure, in which light is emitted at a side (e.g., an outer or exterior surface) of the base substrate 410, the compensation film 100 and the polarizer 200 may be disposed on the exterior surface of the base substrate 410. In one alternative embodiment, for example, where the OLED display has a top emission structure, in which light is emitted at a side (e.g., an outer or exterior surface) of the encapsulation substrate 450, the compensation film 100 and the polarizer 200 may be disposed on the exterior surface of the encapsulation substrate 450.

The compensation film 100 and the polarizer 200 shown in FIG. 5 are substantially the same as the embodiments of the compensation film 100 and the polarizer 200 described above with reference to FIG. 3, and may function as an anti-reflective film for effectively preventing light passing through the polarizer 200 from being reflected by a metal such as an electrode of the organic light emitting panel 400 and emitted outside of the display device. In such an embodiment, the compensation film 100 may reduce the viewing angle dependency as described above to improve the side viewing angle as well as the front viewing angle. Accordingly, the display characteristics of the OLED display may be improved.

Hereinafter, an embodiment of a display panel, where the display panel is a liquid crystal display ("LCD"), will be described with reference to FIG. 6.

Figure 6:
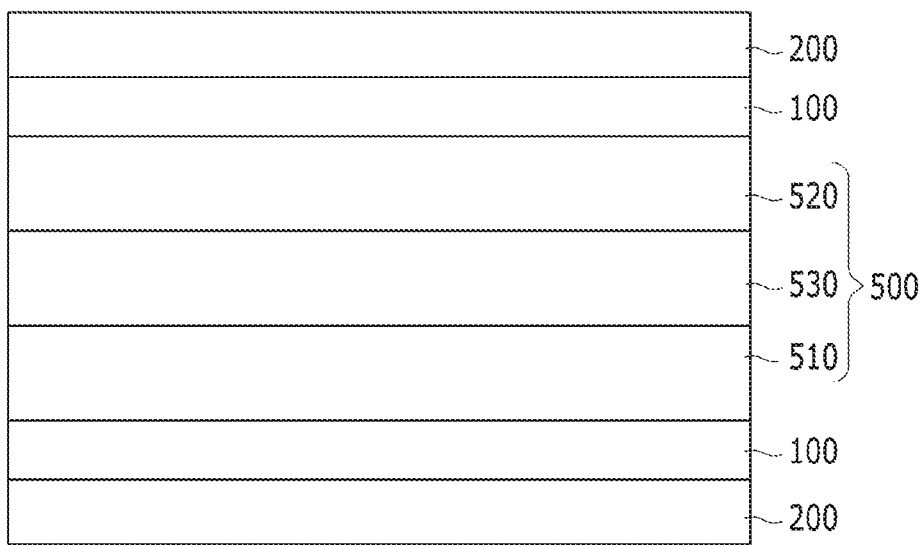
FIG. 6 is a cross-sectional view schematically showing an embodiment of a liquid crystal display ("LCD") device.

FIG. 6 is a cross-sectional view schematically showing an embodiment of an LCD, according to the invention.

Referring to FIG. 6, an embodiment of the LCD includes a liquid crystal display panel 500, a compensation film 100 disposed on a side (e.g., an upper side or a lower side) of the liquid crystal panel 500, and a polarizer element 200 disposed on a side (e.g., an upper side or a lower side) of the compensation film 100.

The liquid crystal panel 500 may be a twist nematic ("TN") mode panel, a vertical alignment ("PVA") mode panel, an in-plane switching ("IPS") mode panel, an optically compensated bend ("OCB") mode panel, or the like.

The liquid crystal panel 500 may include a first display panel 510, a second display panel 520, and a liquid crystal layer 530 interposed between the first display panel 510 and the second display panel 520.

The first display panel 510 may include, for example, a thin film transistor (not shown) disposed on a substrate (not shown) and a first electric field generating electrode (not shown) connected to the thin film transistor, and the second display panel 520 may include, for example, a color filter (not shown) disposed on a substrate (not shown) and a second electric field generating electrode (not shown), but it is not limited thereto. In an alternative embodiment, the color filter may be included in the first display panel 510, while the first electric field generating electrode and the second electric field generating electrode may be disposed on the first display panel 510 together therewith.

In an embodiment, the liquid crystal layer 530 may include a plurality of liquid crystal molecules. The liquid crystal molecules may have positive or negative dielectric anisotropy. In an embodiment, where the liquid crystal molecules have positive dielectric anisotropy, the major (or longitudinal) axes thereof may be aligned substantially parallel to a surface of the first display panel 510 and the second display panel 520 when an electric field is not applied thereto, and the major axes may be aligned substantially perpendicular to the surface of the first display panel 510 and second display panel 520 when an electric field is applied thereto. In an alternative embodiment, where the liquid crystal molecules have negative dielectric anisotropy, the major axes may be aligned substantially perpendicular to the surface of the first display panel 510 and the second display panel 520 when an electric field is not applied thereto, and the major axes may be aligned substantially parallel to the surface of the first display panel 510 and the second display panel 520 when an electric field is applied thereto.

The compensation film 100 and the polarizer 200 are disposed on an outside surface of the liquid crystal panel 500. In an embodiment, as shown in FIG. 6, the compensation film 100 and the polarizer 200 may be disposed on both the lower part and the upper part of the liquid crystal panel 500, but are not limited thereto. In an alternative embodiment, the compensation film 100 and the polarizer 200 may be disposed on only one of the lower part and the upper part of liquid crystal panel 500.

Hereinafter, features of embodiments of the invention will be described in greater detail with reference to examples. However, these examples are merely exemplary, and the invention is not limited thereto.

EXAMPLES

Preparation Example 1: Preparation of First Retardation Layers (Layer A to Layer D)

A poly(styrene-co-methacrylic acid) film (T080, manufactured by TOYO STYRENE) having a thickness of 100 micrometers (μm) is elongated in one axial direction (using a tension tester manufactured by Toyoseiki) at about 125° C.

at a ratio of about 100% to provide a first retardation layer (A) having in-plane retardation of 220 nm at reference wavelength (550 nm).

Further, a poly(styrene-co-methacrylic acid) film (T080, manufactured by TOYO STYRENE) having a thickness of 100 μm is elongated in one axial direction (using a tension tester manufactured by Toyoseiki) at about 125° C. at a ratio of about 120% to provide a first retardation layer (B) having in-plane retardation of 240 nm at reference wavelength (550 nm).

Further, a poly(styrene-co-methacrylic acid) film (T080, manufactured by TOYO STYRENE) having a thickness of 100 μm is elongated in one axial direction (using a tension tester manufactured by Toyoseiki) at about 125° C. at a ratio of about 125% to provide a first retardation layer (C) having in-plane retardation of 250 nm at reference wavelength (550 nm).

Further, a poly(styrene-co-methacrylic acid) film (T080, manufactured by TOYO STYRENE) having a thickness of 100 μm is elongated in one axial direction (using a tension tester manufactured by Toyoseiki) at about 125° C. at a ratio of about 135% to provide a first retardation layer (D) having in-plane retardation of 260 nm at reference wavelength (550 nm).

Preparation Example 2: Preparation of Second Retardation Layers (Layer E to Layer G)

A poly(styrene-co-methacrylic acid) film (T080, manufactured by TOYO STYRENE) having a thickness of 100 μm is elongated in one axial direction (using a tension tester manufactured by Toyoseiki) at about 135° C. at a ratio of about 60% to provide a second retardation layer (E) having in-plane retardation of 100 nm at reference wavelength (550 nm).

Further, a poly(styrene-co-methacrylic acid) film (T080, manufactured by TOYO STYRENE) having a thickness of 100 μm is elongated in one axial direction (using a tension tester manufactured by Toyoseiki) at about 135° C. at a ratio of about 75% to provide a second retardation layer (F) having in-plane retardation of 120 nm at reference wavelength (550 nm).

Further, a poly(styrene-co-methacrylic acid) film (T080, manufactured by TOYO STYRENE) having a thickness of 100 μm is elongated in one axial direction (using a tension tester manufactured by Toyoseiki) at about 135° C. at a ratio of about 80% to provide a second retardation layer (G) having in-plane retardation of 130 nm at reference wavelength (550 nm).

Examples 1 to 8: Manufacturing of Compensation Films

The first retardation layers (A-D) according to Preparation Example 1 and the second retardation layers (E-G) according to Preparation Example 2 are assembled as described in Table 1 below to provide compensation films according to Examples 1 to 8.

Particularly, a first retardation layer and a second retardation layer are assembled in pairs as described in Table 1 by disposing the second retardation layer below the first retardation layer to have a specific angle between the slow axes or the fast axes thereof from 0° to 90°. Subsequently, an adhesion film is transcribed on one side of either the first retardation layer or the second retardation layer, and then the releasing film attached to the other side of the adhesion film is removed to provide a compensation film assembled with the first retardation layer and the second retardation layer maintaining the specific angle between the slow axes or the fast axes thereof. The assembly of the layers is processed by pressure by using a roll-lamination apparatus.

TABLE 1

| Compensation film | First retardation layer (retardation) | First retardation layer (retardation) |
|---|---|---|
| Example 1 | A (220 nm) | E (100 nm) |
| Example 2 | A (220 nm) | F (120 nm) |
| Example 3 | A (220 nm) | G (130 nm) |
| Example 4 | B (240 nm) | E (100 nm) |
| Example 5 | B (240 nm) | F (120 nm) |
| Example 6 | C (250 nm) | G (130 nm) |
| Example 7 | D (260 nm) | E (100 nm) |
| Example 8 | D (260 nm) | F (120 nm) |

Evaluation

The compensation films according to Examples 1 to 8 are evaluated for in-plane retardation and wavelength dispersion depending on the lamination angle of the retardation layers. The in-plane retardation and the wavelength dispersion are measured using AxoScan equipment (manufactured by Axometrics). The measured wavelength ranges from about 400 nm to about 700 nm, and the film retardation is measured by adjusting the incident angle in a range from about −40 degrees to about 40 degrees at an interval of 5 degrees.

The results are shown in FIGS. 7 to 22.

Figure 7:
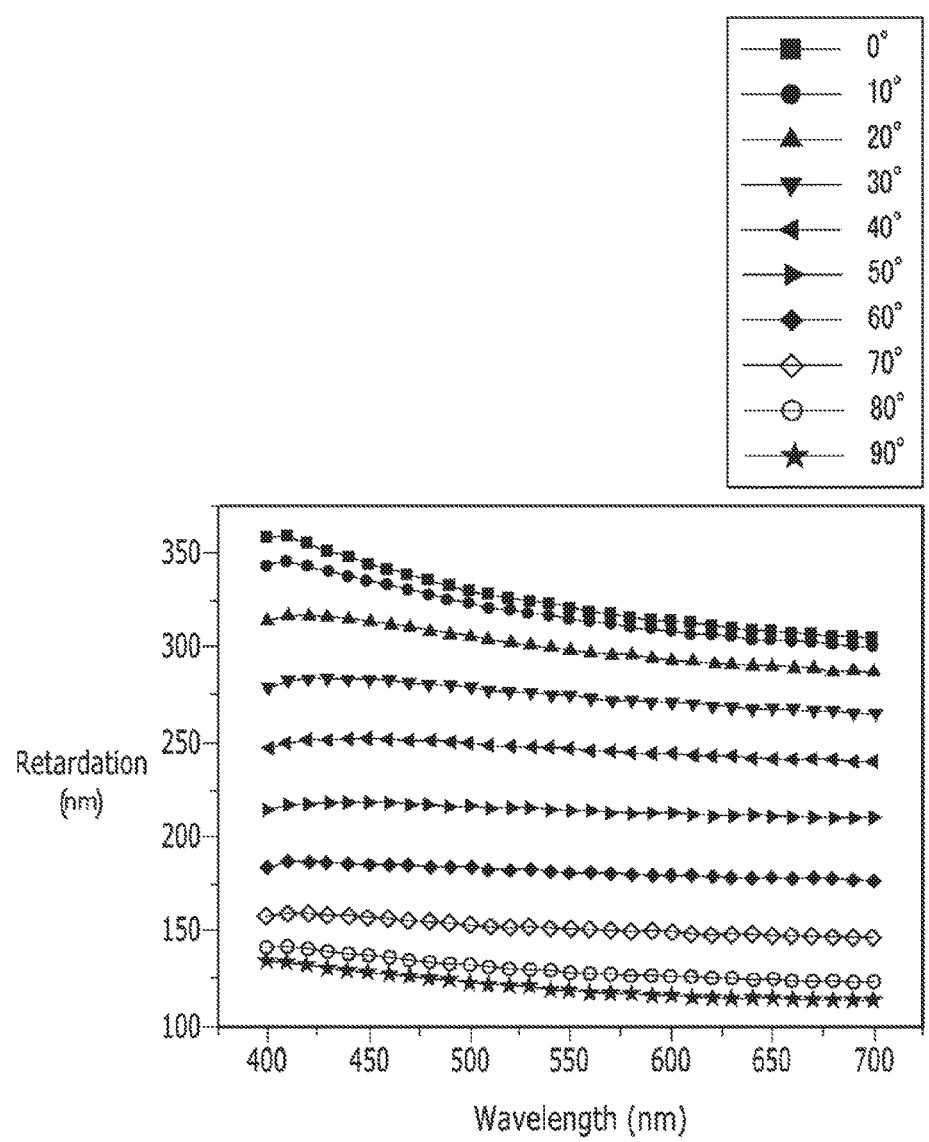
FIG. 7 shows graphs of retardation ($R_e$) versus wavelength of the compensation films prepared in Example 1 by changing the angle between the slow axes of a first retardation layer and a second retardation layer.
Figure 8:
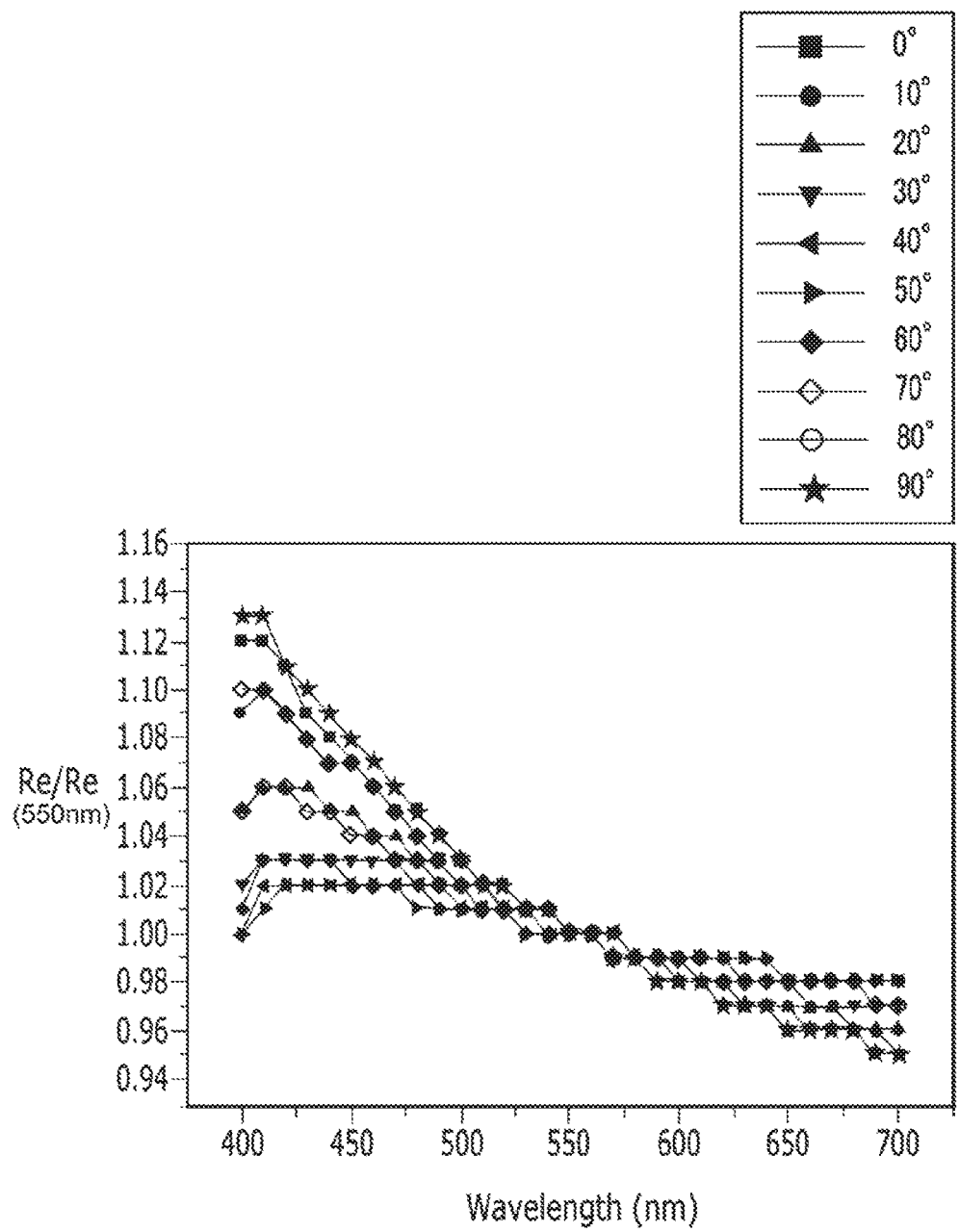
FIG. 8 shows graphs of wavelength dispersion ($R_e/R_e(550\ \text{nm})$) versus wavelength of the compensation films prepared in Example 1.

FIG. 7 shows graphs of retardation ($R_e$) versus wavelength of the compensation films prepared according to Example 1 by changing the angle between the slow axes of the first retardation layer and the second retardation layer from 0° to 90° at an interval of 10 degrees, and FIG. 8 shows graphs of wavelength dispersion ($R_e/R_e(550$ nm)) versus wavelength of each compensation film corresponding to the retardation graphs of FIG. 7.

FIG. 9 shows graphs of retardation ($R_e$) versus wavelength of the compensation films prepared according to Example 2 by changing the angle between the slow axes of the first retardation layer and the second retardation layer from 0° to 90° at an interval of 10 degrees, and FIG. 10 shows graphs of wavelength dispersion ($R_e/R_e(550$ nm)) versus wavelength of each compensation film corresponding to the retardation graphs of FIG. 10.

Figure 11:
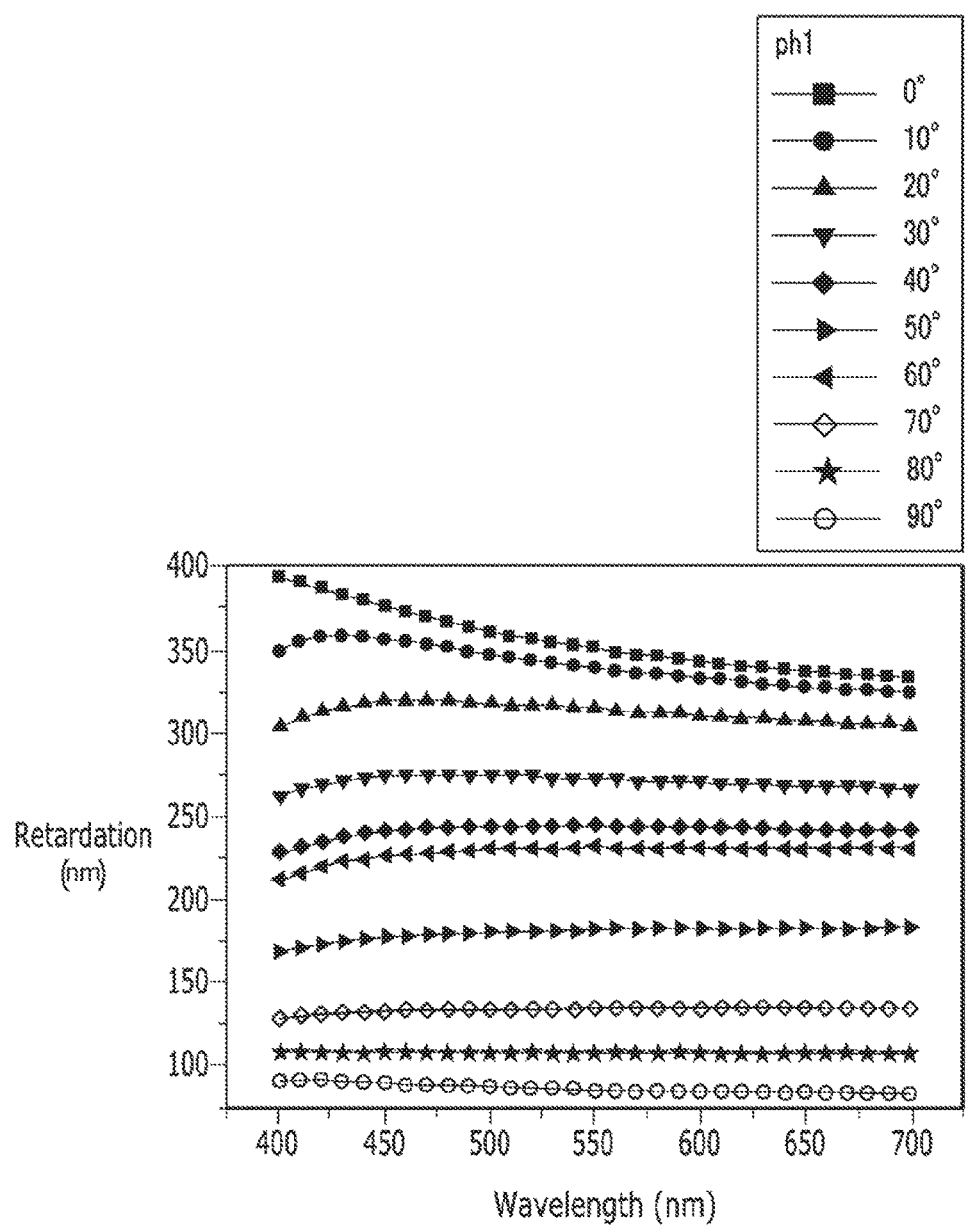
FIG. 11 shows graphs of retardation ($R_e$) versus wavelength of the compensation films prepared in Example 3 by changing the angle between the fast axes of a first retardation layer and a second retardation layer.
Figure 12:
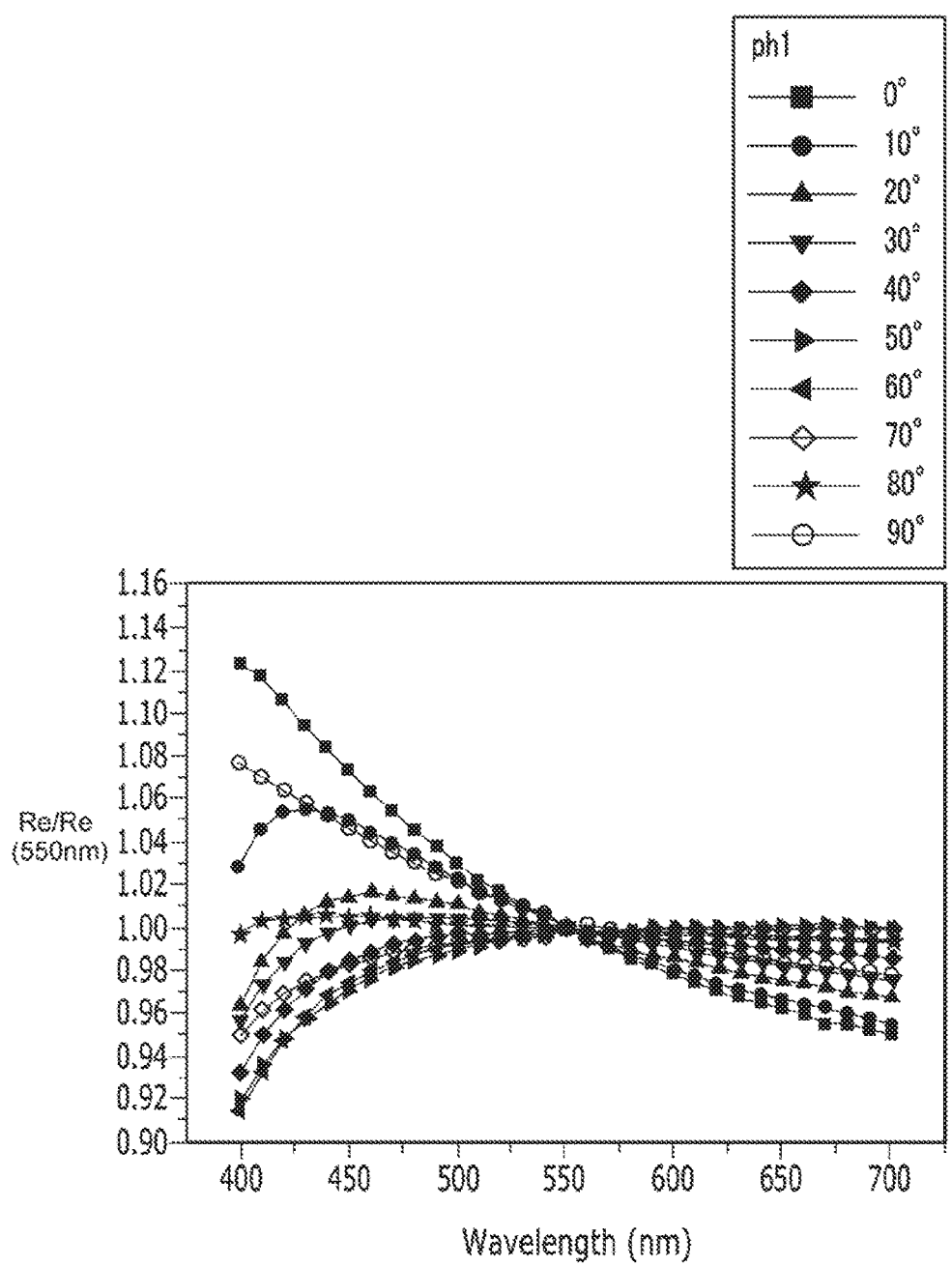
FIG. 12 shows graphs of wavelength dispersion ($R_e/R_e$ (550 nm)) versus wavelength of the compensation films prepared in Example 3.

FIG. 11 shows graphs of retardation ($R_e$) versus wavelength of the compensation films prepared according to Example 3 by changing the angle between the fast axes of the first retardation layer and the second retardation layer from 0° to 90° at an interval of 10 degrees, and FIG. 12 shows graphs of wavelength dispersion ($R_e/R_e(550$ nm)) versus wavelength of each compensation film corresponding to the retardation graphs of FIG. 11.

Figure 13:
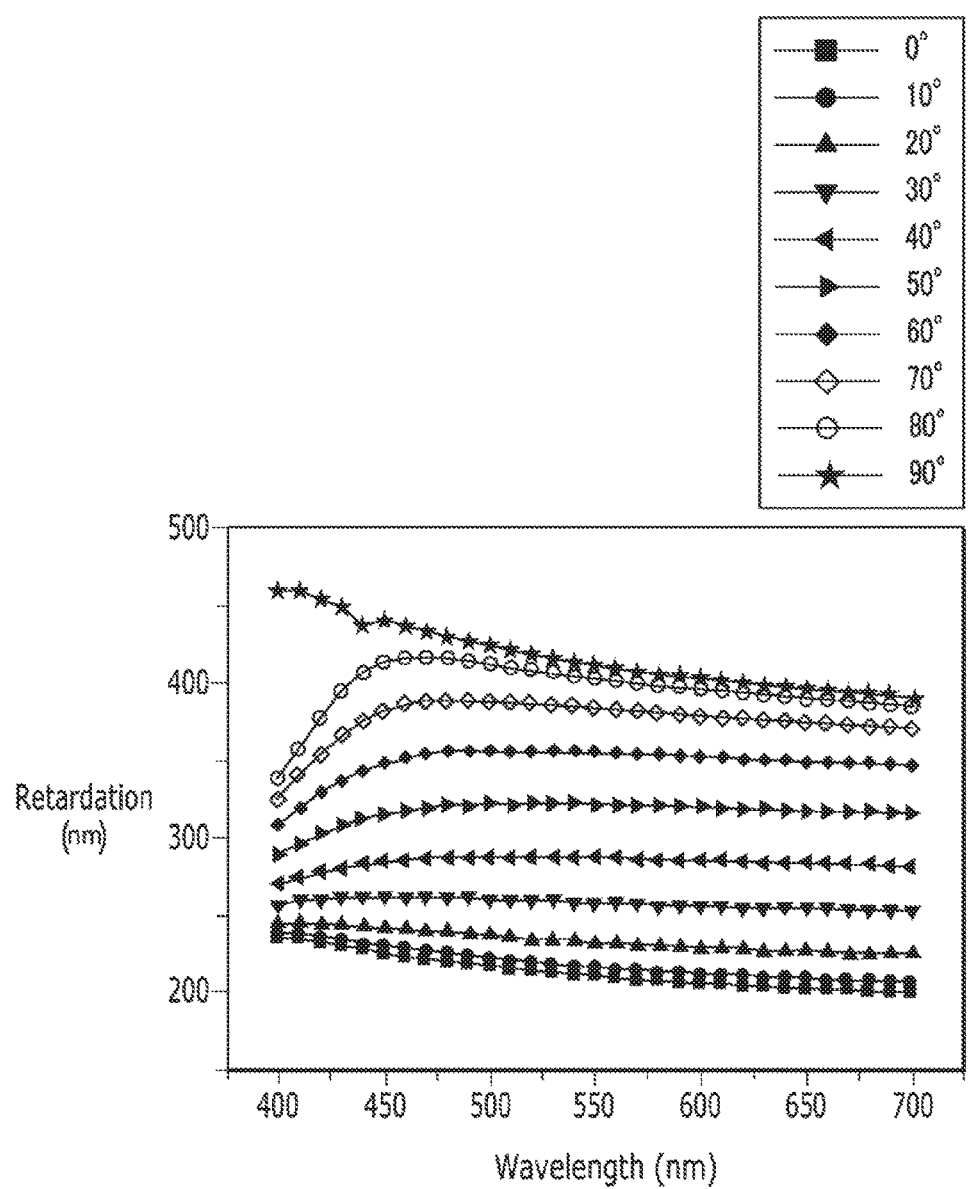
FIG. 13 shows graphs of retardation ($R_e$) versus wavelength of the compensation films prepared in Example 4 by changing the angle between the slow axes of a first retardation layer and a second retardation layer.
Figure 14:
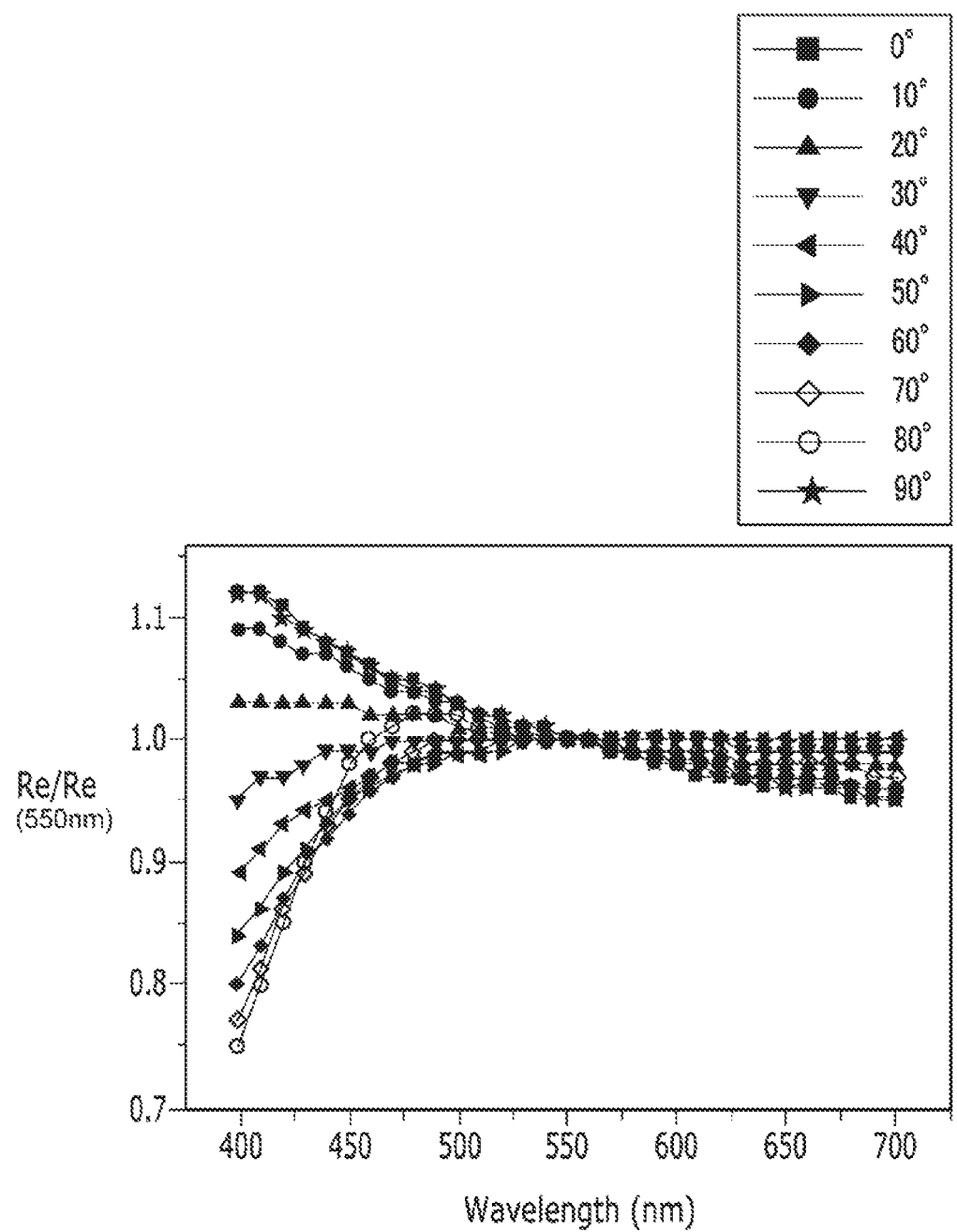
FIG. 14 shows graphs of wavelength dispersion ($R_e/R_e$ (550 nm)) versus wavelength of the compensation films prepared in Example 4.

FIG. 13 shows graphs of retardation ($R_e$) versus wavelength of the compensation films prepared according to Example 4 by changing the angle between the slow axes of the first retardation layer and the second retardation layer from 0° to 90° at an interval of 10 degrees, and FIG. 14 shows graphs of wavelength dispersion ($R_e/R_e(550$ nm)) versus wavelength of each compensation film corresponding to the retardation graphs of FIG. 13.

Figure 15:
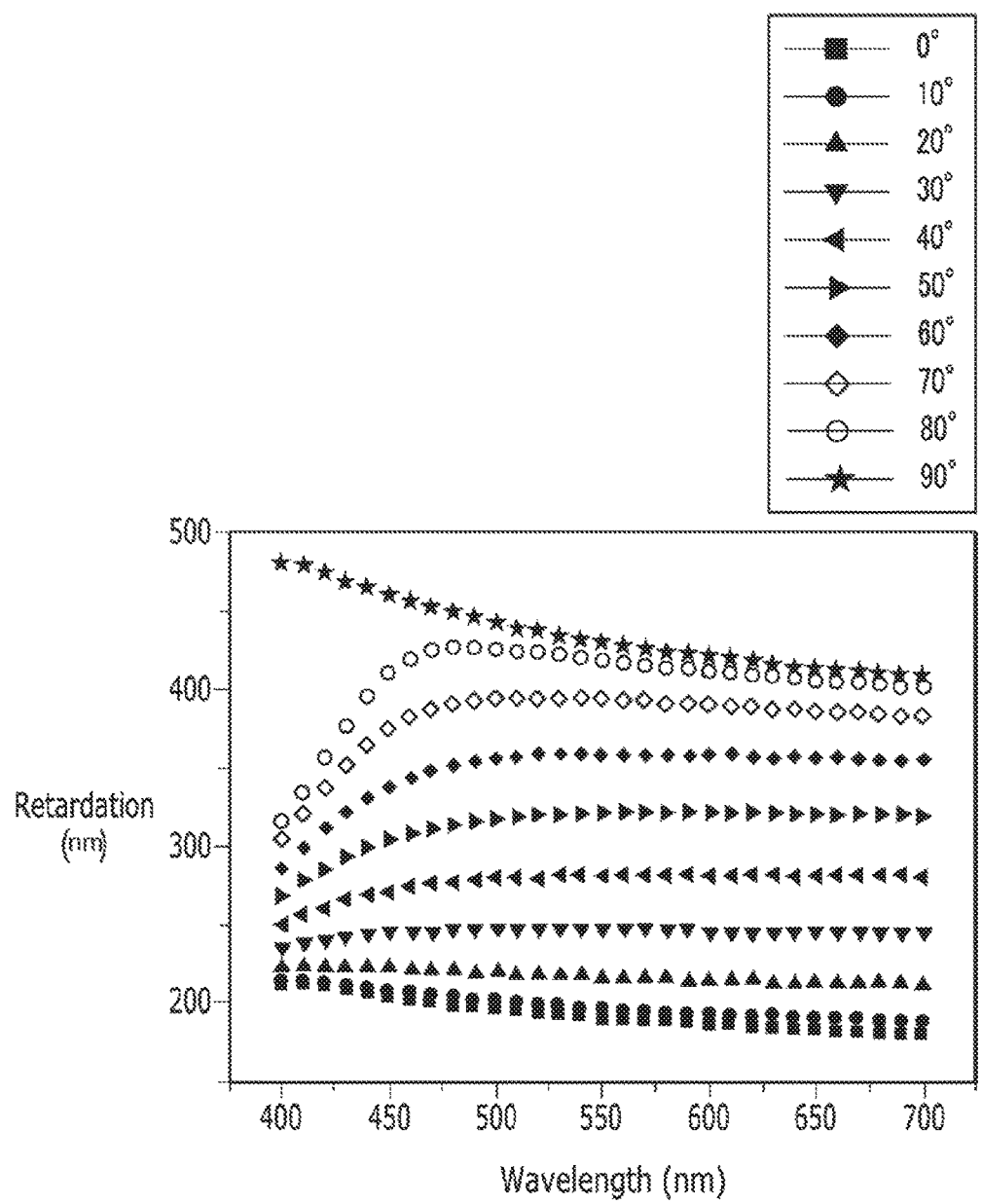
FIG. 15 shows graphs of retardation ($R_e$) versus wavelength of the compensation films prepared in Example 5 by changing the angle between the slow axes of a first retardation layer and a second retardation layer.
Figure 16:
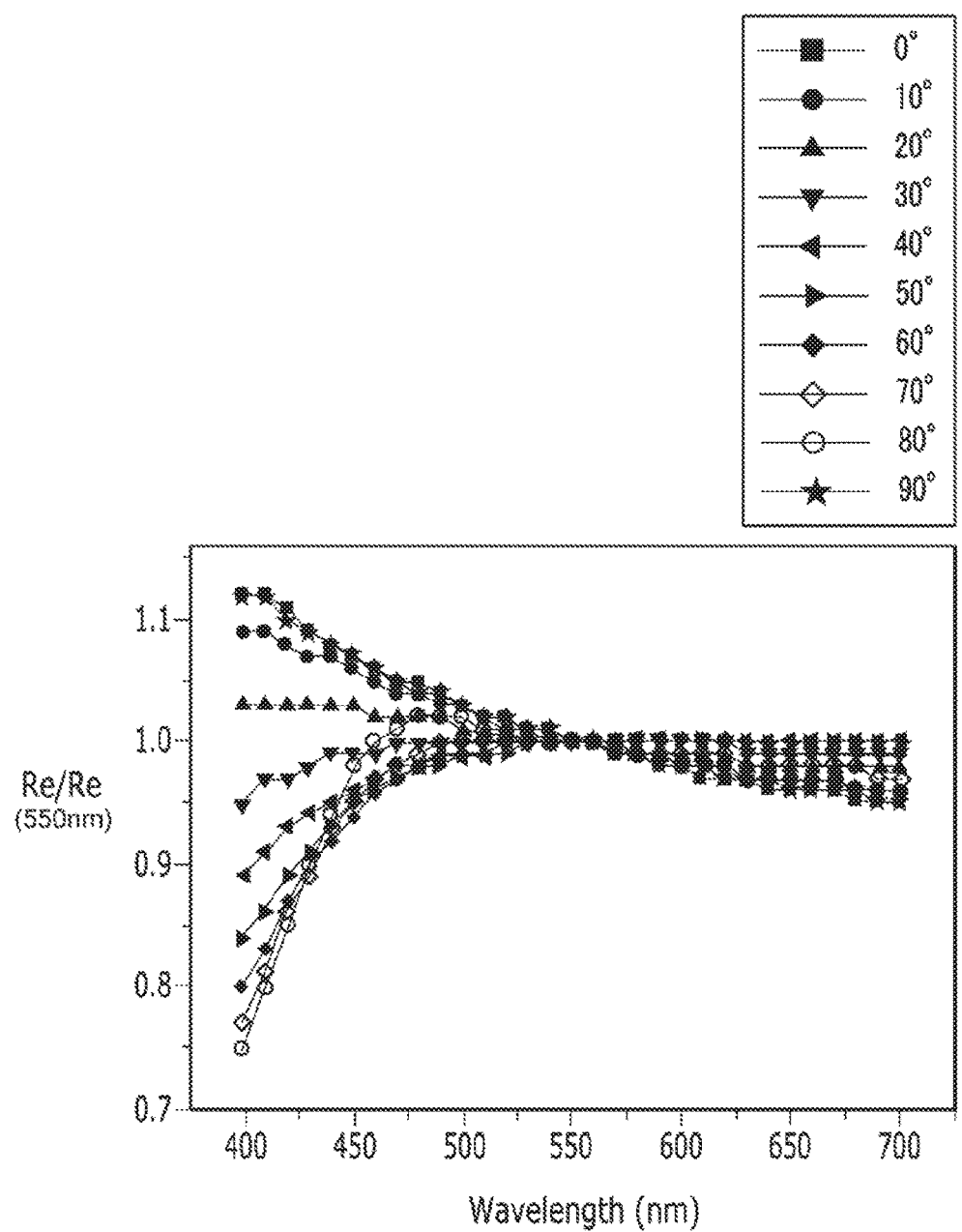
FIG. 16 shows graphs of wavelength dispersion ($R_e/R_e$ (550 nm)) versus wavelength of the compensation films prepared in Example 5.

FIG. 15 shows graphs of retardation ($R_e$) versus wavelength of the compensation films prepared according to Example 5 by changing the angle between the slow axes of the first retardation layer and the second retardation layer from 0° to 90° at an interval of 10 degrees, and FIG. 16 shows graphs of wavelength dispersion ($R_e/R_e(550$ nm))

versus wavelength of each compensation film corresponding to the retardation graphs of FIG. 15.

Figure 17:
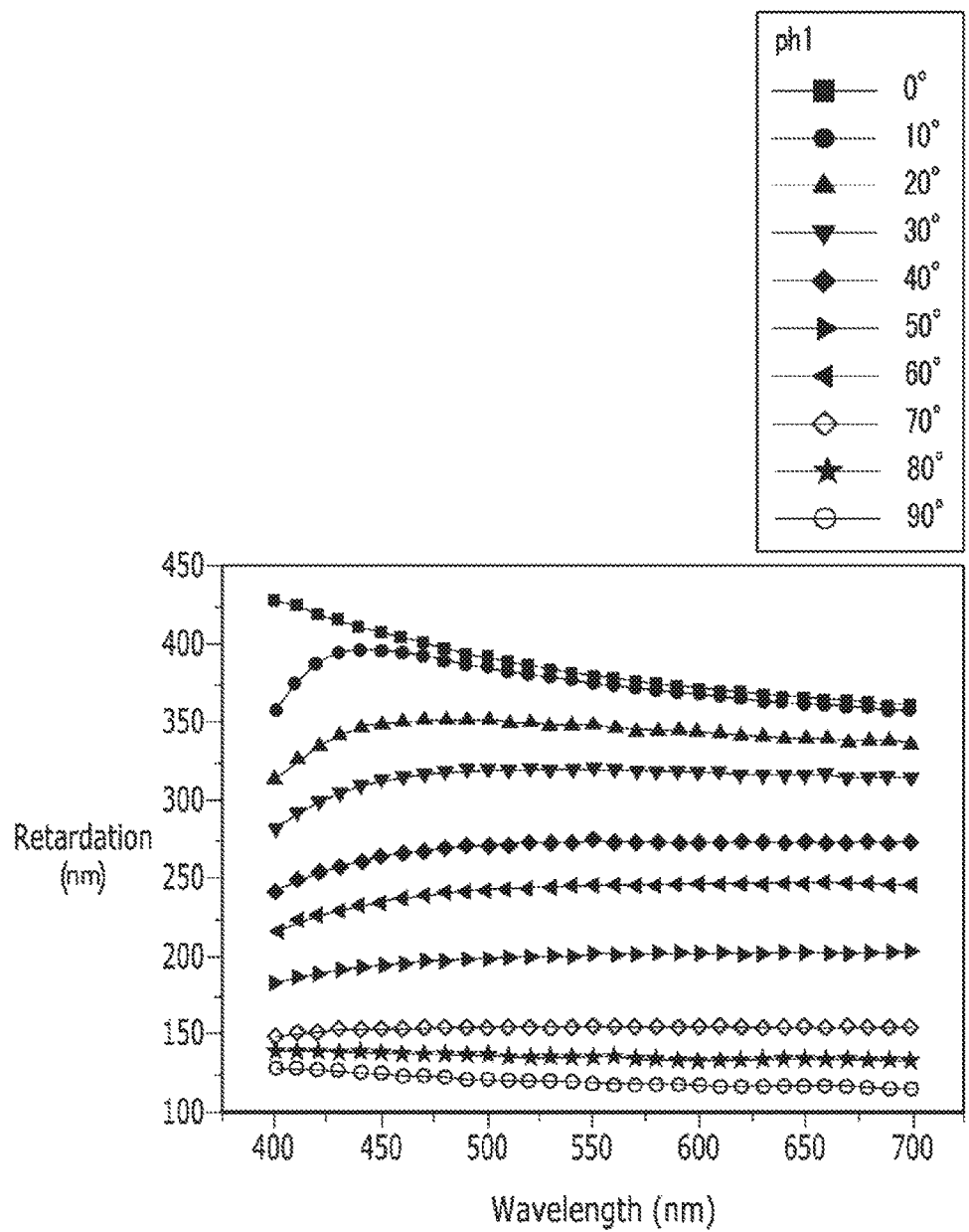
FIG. 17 shows graphs of retardation ($R_e$) versus wavelength of the compensation films prepared in Example 6 by changing the angle between the fast axes of a first retardation layer and a second retardation layer.
Figure 18:
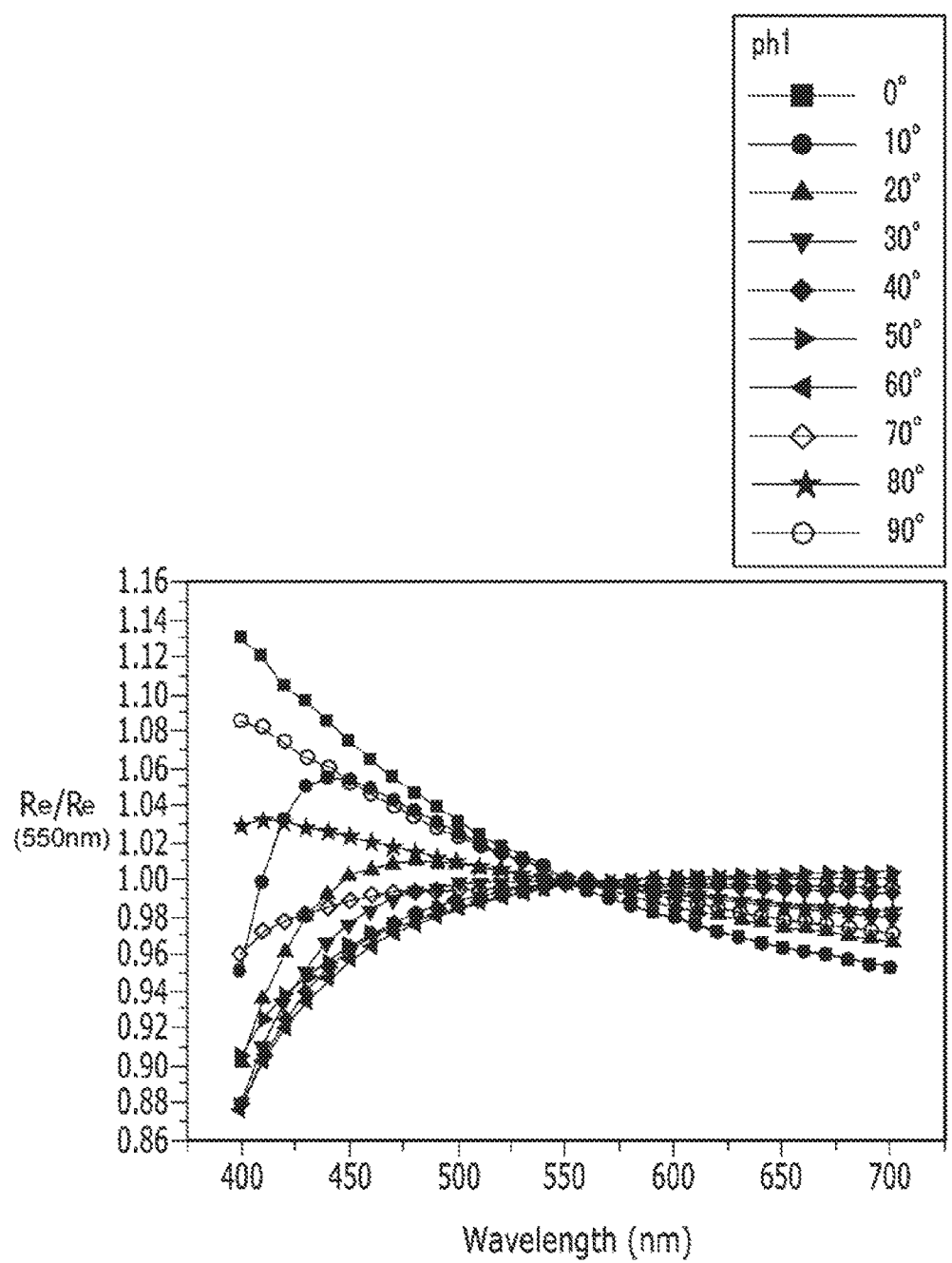
FIG. 18 shows graphs of wavelength dispersion ($R_e/R_e$ (550 nm)) versus wavelength of the compensation films prepared in Example 6.

FIG. 17 shows graphs of retardation ($R_e$) versus wavelength of the compensation films prepared according to Example 6 by changing the angle between the fast axes of the first retardation layer and the second retardation layer from 0° to 90° at an interval of 10 degrees, and FIG. 18 shows graphs of wavelength dispersion ($R_e/R_e$(550 nm)) versus wavelength of each compensation film corresponding to the retardation graphs of FIG. 17.

Figure 19:
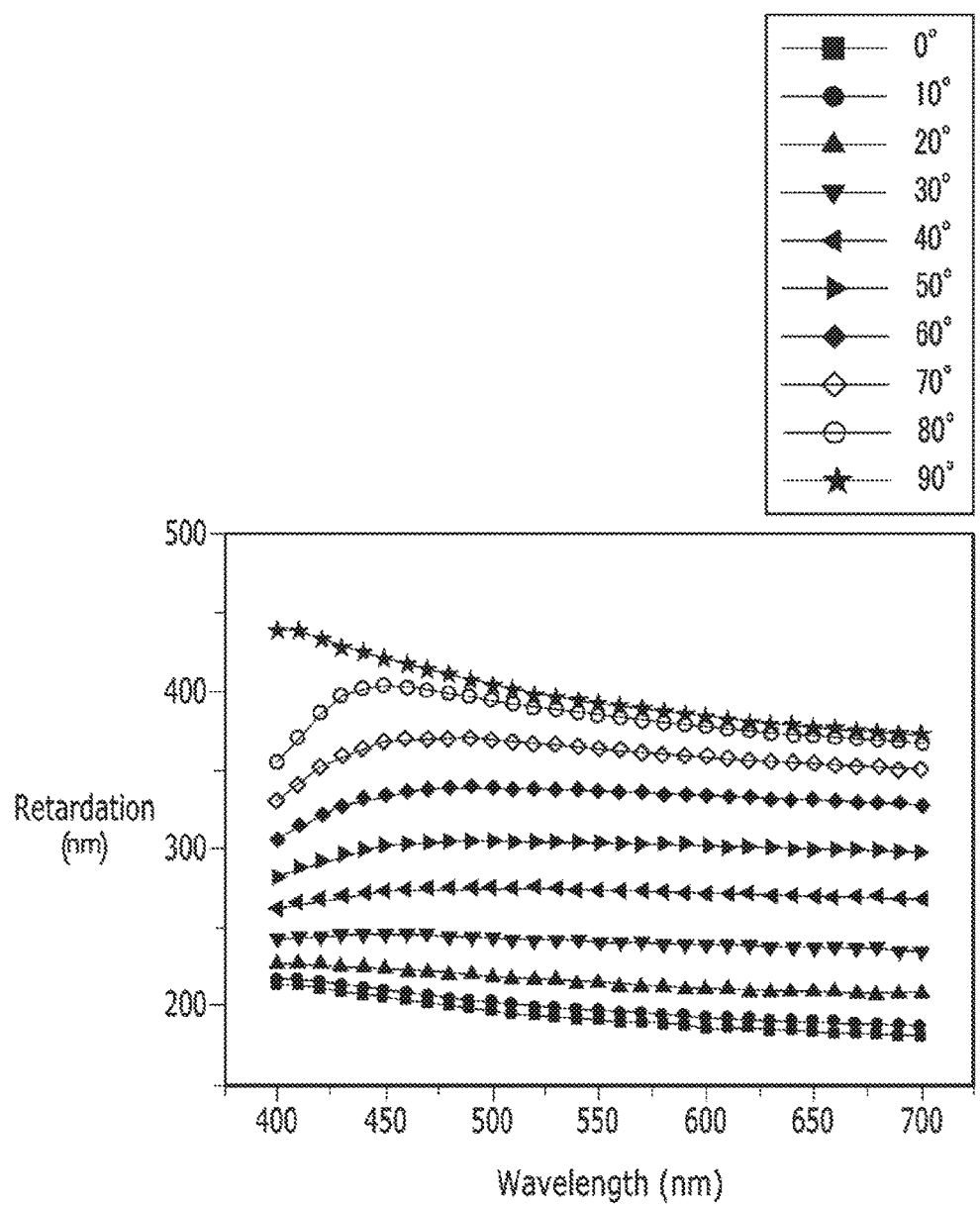
FIG. 19 shows graphs of retardation ($R_e$) versus wavelength of the compensation films prepared in Example 7 by changing the angle between the slow axes of a first retardation layer and a second retardation layer.
Figure 20:
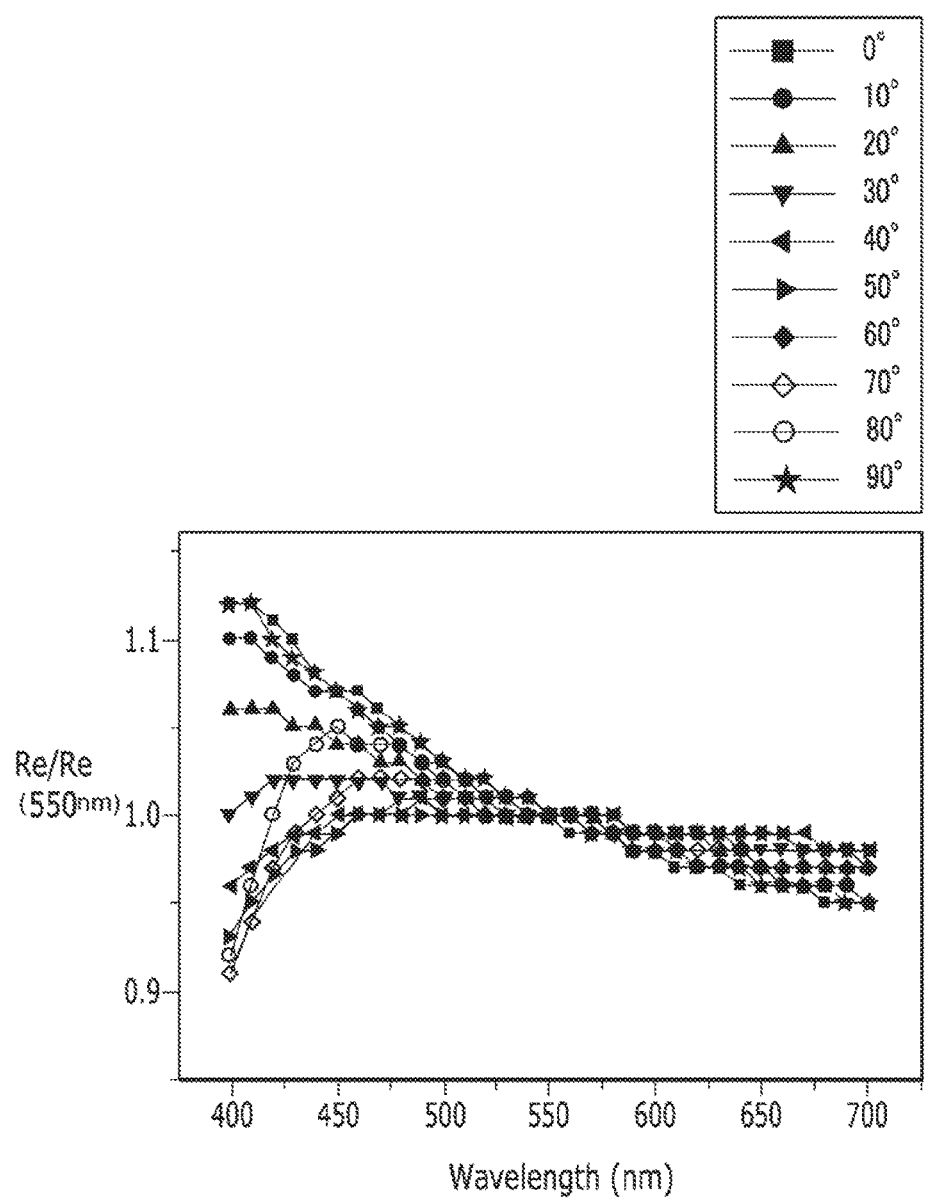
FIG. 20 shows graphs of wavelength dispersion ($R_e/R_e$ (550 nm)) versus wavelength of the compensation films prepared in Example 7.

FIG. 19 shows graphs of retardation ($R_e$) versus wavelength of the compensation films prepared according to Example 7 by changing the angle between the slow axes of the first retardation layer and the second retardation layer from 0° to 90° at an interval of 10 degrees, and FIG. 20 shows graphs of wavelength dispersion ($R_e/R_e$(550 nm)) versus wavelength of each compensation film corresponding to the retardation graphs of FIG. 19.

Figure 21:
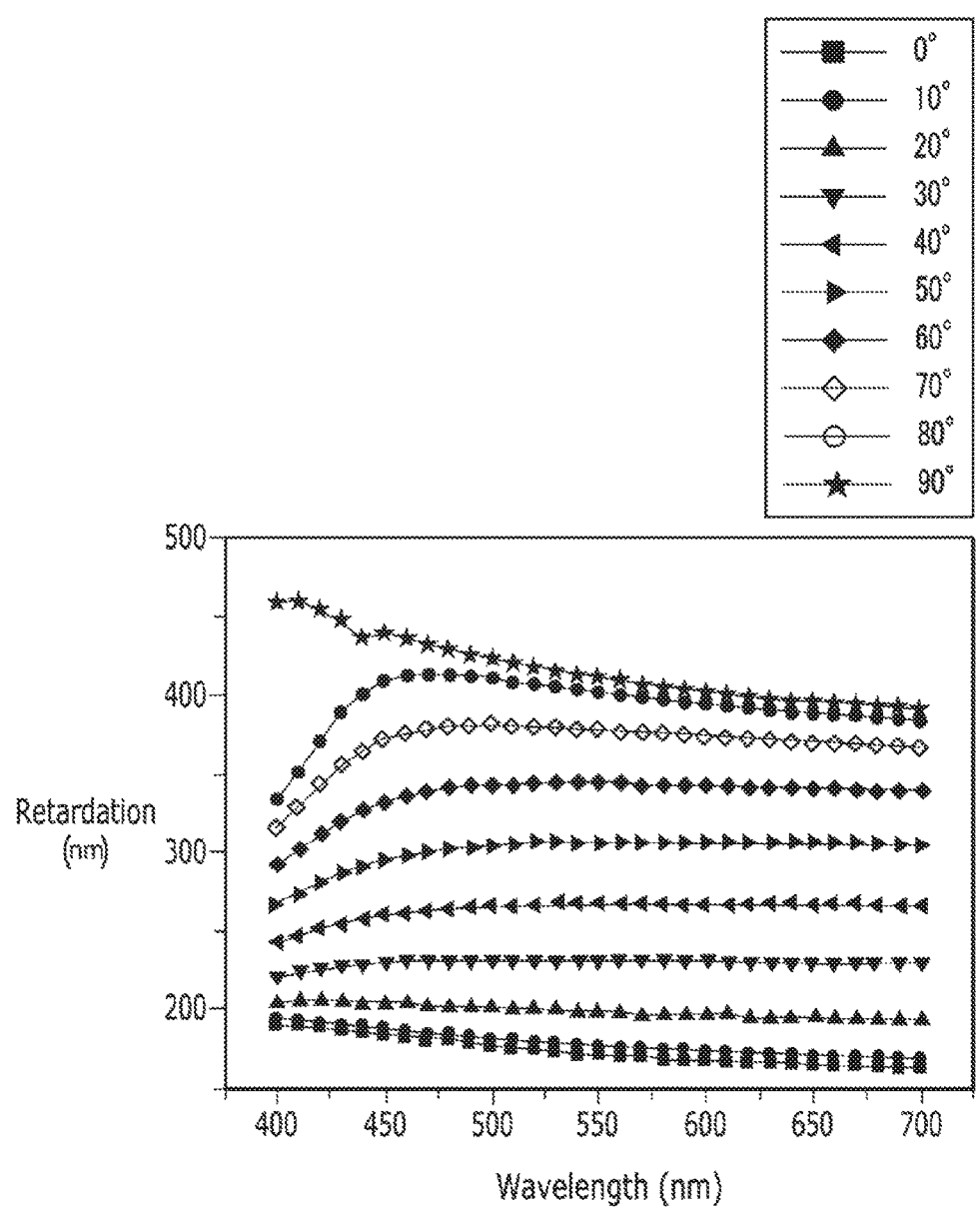
FIG. 21 shows graphs of retardation ($R_e$) versus wavelength of the compensation films prepared in Example 8 by changing the angle between the slow axes of a first retardation layer and a second retardation layer.
Figure 22:
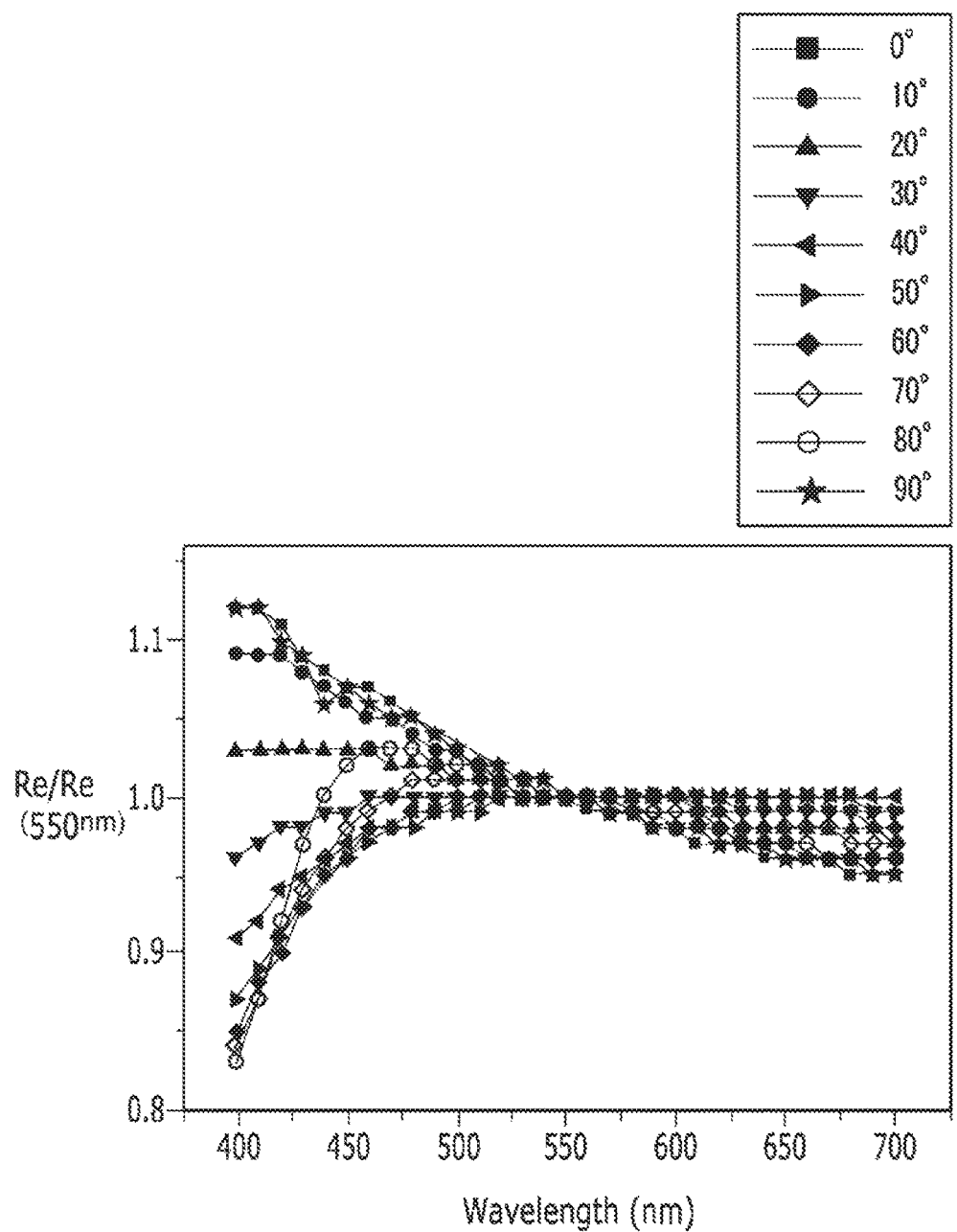
FIG. 22 shows graphs of wavelength dispersion ($R_e/R_e$ (550 nm)) versus wavelength of the compensation films prepared in Example 8.

FIG. 21 shows graphs of retardation ($R_e$) versus wavelength of the compensation films prepared according to Example 8 by changing the angle between the slow axes of the first retardation layer and the second retardation layer from 0° to 90° at an interval of 10 degrees, and FIG. 21 shows graphs of wavelength dispersion ($R_e/R_e$(550 nm)) versus wavelength of each compensation film v the retardation graphs of FIG. 20.

As shown from FIGS. 7 to 22, a compensation film manufactured by laminating two polymer films having negative birefringence as a first retardation layer and a second retardation layer, respectively, may have different retardations depending on the lamination angle of the first and second retardation layers, and, for example, may have the reverse wavelength dispersion by laminating the two retardation layers, each having predetermined retardation, to have a predetermined angle of lamination in relation to the fast axes or the slow axes.

As described herein, embodiments of the compensation film according to the invention may be easily manufactured by assembling two known polymer films having negative birefringence, such that diversity of materials to be selected, simplification of processes, cost saving effectiveness, and the like may be accomplished. In such embodiments, the compensation film may have the reverse wavelength dispersion, for example, in a short wavelength region, such that a display device including the compensation film may have improved display characteristics.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A compensation film comprising:
   a first retardation layer comprising a polymer, and
   a second retardation layer comprising a polymer,
   wherein
   the first retardation layer has an in-plane retardation ($R_{e1}$) in a range of about 180 nanometers to about 300 nanometers for incident light having a wavelength of about 550 nanometers,
   the second retardation layer has an in-plane retardation ($R_{e2}$) in a range of about 60 nanometers to about 170 nanometers for the incident light having the wavelength of about 550 nanometers,
   an entire in-plane retardation ($R_{e0}$) of the first retardation layer and the second retardation layer for incident light having wavelengths of about 450 nanometers and about 550 nanometers satisfies the following inequation: $R_{e0}$ (450 nm)<$R_{e0}$ (550 nm),
   the first retardation layer comprises an elongated polymer film comprising the polymer of the first retardation layer,
   refractive indices of the first retardation layer satisfy the following Inequation: $n_{x1}<n_{y1} \leq n_{z1}$ or $n_{x1}<n_{z1} \leq n_{y1}$, wherein $n_{x1}$ denotes a refractive index in an elongation direction of the polymer film of the first retardation layer, $n_{y1}$ denotes an in-plane refractive index in a direction perpendicular to a direction of the $n_{x1}$, and $n_{z1}$ denotes an out-of-plane refractive index in a direction perpendicular to both directions of $n_{x1}$ and $n_{y1}$,
   the second retardation layer comprises an elongated polymer film comprising the polymer of the second retardation layer, and
   refractive indices of the second retardation layer satisfy the following inequation: $n_{x2}<n_{y2} \leq n_{z2}$, or $n_{x2}<n_{z2} \leq n_{y2}$, wherein $n_{x2}$ denotes a refractive index in an elongation direction of the polymer film of the second retardation layer, $n_{y2}$ denotes an in-plane refractive index in a direction perpendicular to a direction of the $n_{x2}$, and $n_{z2}$ denotes an out-of-plane refractive index in a direction perpendicular to both directions of $n_{x2}$ and $n_{y2}$.

2. The compensation film according to claim 1, wherein the entire in-plane retardation ($R_{e0}$) of the first retardation layer and the second retardation layer for the incident light having the wavelengths of about 450 nanometers and about 550 nano meters satisfies the following inequation: $0.7 \leq R_{e0}$ (450 nm)/$R_{e0}$ (550 nm)<1.0.

3. The compensation film according to claim 1, wherein an angle between a slow axis of the first retardation layer and a slow axis of the second retardation layer is from about 20° to about 85°.

4. The compensation film according to claim 1, wherein an angle between a slow axis of the first retardation layer and a slow axis of the second retardation layer is from about 25° to about 80°.

5. The compensation film according to claim 1, wherein an angle between a slow axis of the first retardation layer and a slow axis of the second retardation layer is from about 30° to about 70°.

6. The compensation film according to claim 1, wherein an angle between a fast axis of the first retardation layer and a fast axis of the second retardation layer is from about 20° to about 80°.

7. The compensation film according to claim 1, wherein an angle between a fast axis of the first retardation layer and a fast axis of the second retardation layer may be from about 25° to about 75°.

8. The compensation film according to claim 1, wherein each of the polymer of the first retardation layer and the polymer of the second retardation layer independently comprises at least one of polystyrene, poly(styrene-co-maleic anhydride), polymaleimide, poly(meth)acrylic acid, polyacrylonitrile, polymethyl(meth)acrylate, cellulose ester, poly (styrene-co-acrylonitrile), poly(styrene-co-maleimide), poly (styrene-co-methacrylic acid), a derivative thereof, a copolymer thereof, and a mixture thereof.

9. The compensation film according to claim 1, wherein the first retardation layer has an in-plane retardation ($R_{e1}$) in a range of about 200 nanometers to about 280 nanometers for the incident light having the wavelength of about 550 nanometers, and the second retardation layer has an in-plane retardation ($R_{e2}$) in a range of about 80 nanometers to about 150 nanometers for the incident light having the wavelength of about 550 nanometers.

10. An optical film comprising:
a polarizer; and
the compensation film according to claim 1.

11. A display device comprising:
a display panel;
a compensation film disposed on the display panel; and
a polarizer disposed on the compensation film,
wherein the compensation film comprises:
  a first retardation layer comprising a polymer; and
  a second retardation layer comprising a polymer,
wherein
the first retardation layer has an in-plane retardation ($R_{e1}$) in a range of about 180 nanometers (nm) to about 300 nm for incident light having a wavelength of about 550 nm,
the second retardation layer has an in-plane retardation ($R_{e2}$) in a range of about 60 nm to about 170 nm for the incident light having the wavelength of about 550 nm,
an entire in-plane retardation ($R_{e0}$) of the first retardation layer and the second retardation layer for the incident light having wavelengths of about 450 nm and about 550 nm satisfies the following inequality: $R_{e0}$ (450 nm)<$R_{e0}$ (550 nm),
the first retardation layer comprises an elongated polymer film comprising the polymer of the first retardation layer,
refractive indices of the first retardation layer satisfy the following inequation: $n_{x1}<n_{y1} \leq n_{z1}$ or $n_{x1}<n_{z1} \leq n_{y1}$, wherein $n_{x1}$ denotes a refractive index in an elongation direction of the polymer film of the first retardation layer, $n_{y1}$ denotes an in-plane refractive index in a direction perpendicular to a direction of the $n_{x1}$, and $n_{z1}$ denotes an out-of-plane refractive index in a direction perpendicular to both directions of $n_{x1}$ and $n_{y1}$,
the second retardation layer comprises an elongated polymer film comprising the polymer of the second retardation layer, and
refractive indices of the second retardation layer satisfy the following inequation: $n_{x2}<n_{y2} \leq n_{z2}$ or $n_{x2}<n_{z2} \leq n_{y2}$, wherein $n_{x2}$ denotes a refractive index in an elongation direction of the polymer film of the second retardation layer, $n_{y2}$ denotes an in-plane refractive index in a direction perpendicular to a direction of the $n_{x2}$, and $n_{z2}$ denotes an out-of-plane refractive index in a direction perpendicular to both directions of $n_{x2}$ and $n_{y2}$.

12. The display device according to claim 11, wherein the entire in-plane retardation ($R_{e0}$) of the first retardation layer and the second retardation layer for the incident light having the wavelengths of about 450 nm and about 550 nm satisfies the following inequation: $0.7 \leq R_{e0}(450 \text{ nm})/R_{e0}(550 \text{ nm})<1.0$.

13. The display device according to claim 11, wherein an angle between a slow axis of the first retardation layer and a slow axis of the second retardation layer is from about 20° to about 85°.

14. The display device according to claim 11, wherein an angle between a slow axis of the first retardation layer and a slow axis of the second retardation layer is from about 25° to about 80°.

15. The display device according to claim 11, wherein an angle between a fast axis of the first retardation layer and a fast axis of the second retardation layer is from about 20° to about 80°.

16. The display device according to claim 11, wherein an angle between a fast axis of the first retardation layer and a fast axis of the second retardation layer is from about 25° to about 75°.

17. The device according to claim 11, wherein each of the polymer of the first retardation layer and the polymer of the second retardation layer independently comprises at least one of polystyrene, poly(styrene-co-maleic anhydride), polymaleimide, poly(meth)acrylic acid, polyacrylonitrile, polymethyl(meth)acrylate, cellulose ester, poly(styrene-co-acrylonitrile), poly(styrene-co-maleimide), poly(styrene-co-methacrylic acid), a derivative thereof, a copolymer thereof, and a mixture thereof.

18. The display device of claim 11, wherein the display panel is a liquid crystal display panel or an organic light emitting display panel.

* * * * *